US012712555B2

(12) United States Patent
Degani et al.

(10) Patent No.: US 12,712,555 B2
(45) Date of Patent: Aug. 18, 2026

(54) MULTI-PHASE SIGNAL GENERATION SCHEME AND METHOD THEREOF

(71) Applicant: Intel Corporation, Santa Clara, CA (US)

(72) Inventors: Ofir Degani, Haifa (IL); Run Levinger, Portland, OR (US); Ashoke Ravi, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 115 days.

(21) Appl. No.: 17/956,835

(22) Filed: Sep. 30, 2022

(65) Prior Publication Data

US 2024/0120929 A1 Apr. 11, 2024

(51) Int. Cl.

*H03L 7/099* (2006.01)
*G06F 1/06* (2006.01)
*H03K 5/15* (2006.01)

(52) U.S. Cl.

CPC .............. *H03L 7/0998* (2013.01); *G06F 1/06* (2013.01); *H03K 5/1506* (2013.01)

(58) Field of Classification Search

CPC ....... H03K 5/1506; H03L 7/0998; H03L 7/24; H04L 7/002; H04L 7/0025; H04L 7/0029; G06F 1/06; G06F 1/10; G06F 1/12
USPC ........ 375/362, 373, 376; 327/144, 145, 291, 327/293, 295; 331/59, 108 R
See application file for complete search history.

(56) References Cited

U.S. PATENT DOCUMENTS

2010/0117692 A1* 5/2010 Yoon ........................ H03K 5/13 327/144
2010/0148842 A1* 6/2010 Yoon ........................ G11C 7/22 327/295
2015/0145579 A1* 5/2015 Lin ........................ H03L 7/0814 327/243
2016/0249004 A1* 8/2016 Saeki ........................ H03L 7/08
2021/0281253 A1* 9/2021 Kalcher ............. H03K 5/00006
2021/0305994 A1* 9/2021 Kim ..................... G11C 27/024

* cited by examiner

*Primary Examiner* — Young T. Tse
(74) *Attorney, Agent, or Firm* — Viering, Jentschura & Partner mbB

(57) ABSTRACT

The present disclosure relates to a signal generator including: a plurality of interpolators, each interpolator being configured to: receive a first input signal having a first phase, and a second input signal having a second phase; generate a plurality of interpolated signals based on a plurality of interpolations of the input signals, each interpolated signal having a respective phase based on the respective interpolation, and combine the interpolated signals to provide an output signal; the plurality of interpolators including: a first plurality of interpolators, each interpolator being configured to receive as input signals a first reference signal and a second reference signal; and a second plurality of interpolators, each interpolator being configured to receive as first input signal an output signal from an interpolator of the first plurality of interpolators and as second input signal another output signal from another interpolator of the first plurality of interpolators.

19 Claims, 8 Drawing Sheets

Figure 4:
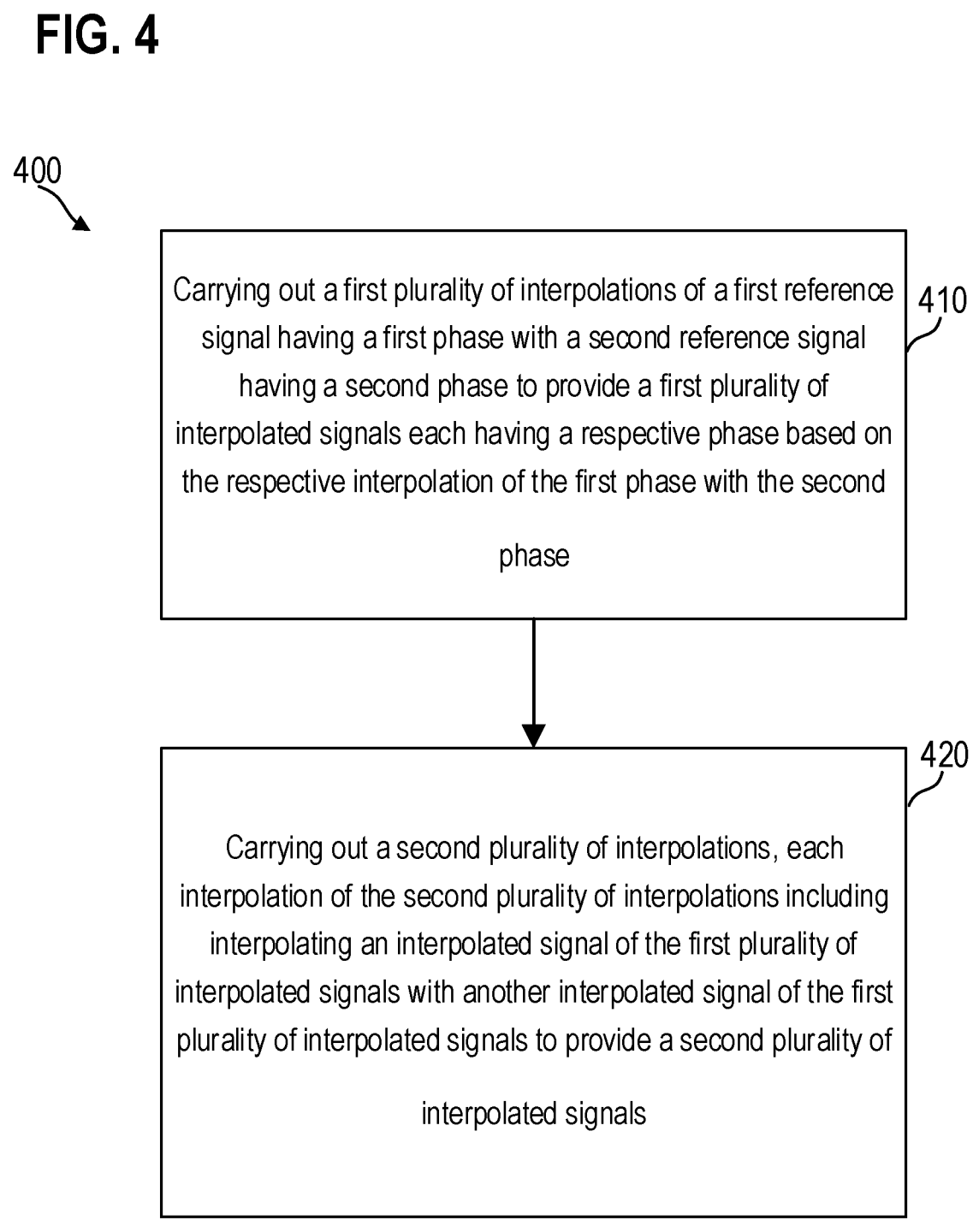

Carrying out a first plurality of interpolations of a first reference signal having a first phase with a second reference signal having a second phase to provide a first plurality of interpolated signals each having a respective phase based on the respective interpolation of the first phase with the second phase

410

Carrying out a second plurality of interpolations, each interpolation of the second plurality of interpolations including interpolating an interpolated signal of the first plurality of interpolated signals with another interpolated signal of the first plurality of interpolated signals to provide a second plurality of interpolated signals

420

MULTI-PHASE SIGNAL GENERATION SCHEME AND METHOD THEREOF

TECHNICAL FIELD

The present disclosure relates generally to a multi-phase local oscillator, a signal generator configured to generate a multi-phase signal, an oscillator circuit configured to generate an oscillator signal based on a multi-phase signal, and methods thereof (e.g., a method of generating a multi-phase signal).

BACKGROUND

In general, various technologies and standards have been developed for wireless communication, which is at the basis of a variety of services and applications in everyday life. In emerging communication architectures, simultaneous multi-phase generation plays an important role for various aspects of signal reception and transmission, such as frequency up-conversion, frequency down-conversion, signal filtering, power management, and/or signal amplification. When the number of phases is sufficiently low, e.g. four or less, there are known techniques in the art to generate such multi-phase signals. However, for increasing number of phases (e.g., more than four) there are no efficient and scalable strategies for generating such multi-phase signals. As an exemplary application, for digital power amplifiers more than four phases are required to increase the overall transmitted power. For example, an octa-phase digital power amplifier is a good tradeoff between complexity and efficiency, but it requires eight different local oscillator (LO) phases. Advanced strategies for the generation of multi-phase oscillator signals may thus provide improvements in the overall performances of wireless communication devices.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosure. In the following description, various aspects of the disclosure are described with reference to the following drawings, in which:

FIG. 4 shows an exemplary flow diagram of a method of generating a multi-phase signal, according to the present disclosure;

DESCRIPTION

Figure 1:
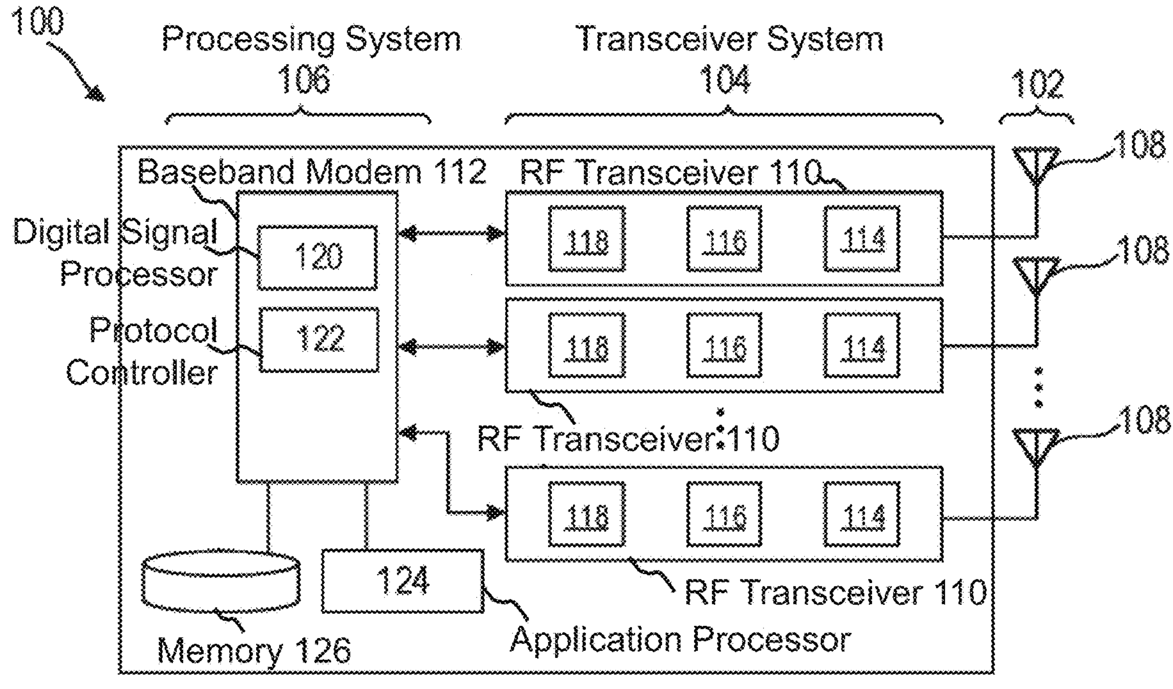
FIG. 1 shows an exemplary wireless communication device in a schematic view according to the present disclosure.

The following detailed description refers to the accompanying drawings that show, by way of illustration, specific details and aspects in which the disclosure may be practiced. These aspects are described in sufficient detail to enable those skilled in the art to practice the disclosure. Other aspects may be utilized and structural, logical, and electrical changes may be made without departing from the scope of the disclosure. The various aspects are not necessarily mutually exclusive, as some aspects may be combined with one or more other aspects to form new aspects. Various aspects are described in connection with methods and various aspects are described in connection with devices (e.g., a signal generator, an oscillator circuit, a multi-phase local oscillator, etc.). However, it may be understood that aspects described in connection with methods may similarly apply to the devices, and vice versa.

In general, communication devices make use of local oscillators for various aspects of transmitting and/or receiving radio signals. A local oscillator may provide, as output, an oscillator signal at a desired frequency, and the oscillator signal may be used for various purposes, such as for mixing with another signal to provide a frequency up-converted signal or a frequency down-converted signal, or as clock signal for various components of a device, such as a processor, a power amplifier, a filter, and the like. In particular, in wireless communication based on radio waves, oscillator signals at high frequencies may be required to implement various functionalities, for example to up-convert a baseband signal to the radio frequency range (e.g., the frequency range from 30 Hz to 300 GHz) or mmWave frequency range (e.g., the frequency range from 30 GHz to 300 GHz). To reach such high frequency ranges, a wireless communication device may include one or more oscillator circuits configured to enable frequency multiplication, e.g. configured to receive an input signal at a certain frequency and provide an output signal at a frequency that is a multiple of the frequency of the input signal. Frequency multiplication allows carrying out preliminary operations in a low frequency range (and thus with simpler components, and a lower power consumption), and then reach the desired high frequency range.

Various applications may benefit from multi-phase oscillator signals, illustratively various applications may benefit from having available a plurality of signals oscillating at a desired frequency (e.g., in the mmWave frequency range, for example) and having a phase offset with respect to one another. As an example, such multi-phase oscillator signals may be fed to a digital multi-phase amplifier to provide efficient signal amplification. As another example, such multi-phase oscillator signals may be fed to a multi-phase filter to adapt the sampling rate in a simple, yet flexible manner.

In general, various architectures exist for providing frequency multipliers and multi-phase oscillator signals. However, the existing topologies are not easily scalable. In particular, for increasing number of phases to be provided for the oscillator signal(s), there is no efficient way (e.g., in terms of number of components and power consumption) to provide multi-phase oscillator signals.

The present disclosure is related to an adapted scheme to effectively generate a multi-phase oscillator signal without suffering from the limitations of the conventional approaches in relation to the number of phases that may be generated. The present disclosure is related to an adapted signal generator and an adapted oscillator circuit, which in combination may provide an adapted multi-phase local oscillator to enable an easily scalable way of generating multi-phase oscillator signals. In particular, the present disclosure may be based on the realization that successive interpolations of signals having different phases may provide a simple, yet accurate configuration for generating a multi-phase signal. The multi-phase signal may then be fed to the oscillator circuit (or to an array of oscillator circuits) for frequency multiplication and for generating a multi-phase oscillator signal.

According to the present disclosure, a signal generator may include: a plurality of interpolators, each interpolator of the plurality of interpolators being configured to: receive a first input signal having a first phase, and a second input signal having a second phase; generate a plurality of interpolated signals based on a plurality of interpolations of the first input signal with the second input signal, each interpolated signal having a respective phase based on the respective interpolation of the first phase with the second phase, and combine the interpolated signals with one another to provide an output signal. The plurality of interpolators may include: a first plurality of interpolators, each interpolator of the first plurality of interpolators being configured to receive as first input signal a first reference signal and as second input signal a second reference signal; and a second plurality of interpolators, each interpolator of the second plurality of interpolators being configured to receive as first input signal an output signal from an interpolator of the first plurality of interpolators and as second input signal another output signal from another interpolator of the first plurality of interpolators.

The adapted signal generator described herein may thus include a plurality of interpolator layers to carry out a plurality of successive interpolations. An interpolator layer may receive, as input signals, the output signals from the preceding interpolator layer and provide, as output signals, a plurality of interpolated signals based on a plurality of interpolations of the input signals. Carrying out a sequence of interpolations may provide refining the phases of the output signals with a finer granularity at each interpolator layer. The adapted signal generator including a cascade of interpolator layers may thus provide achieving a fine resolution in terms of phases that may be generated, while allowing to use a limited number of components. This approach provides thus a cost-efficient and low-complexity configuration for generating a multi-phase signal (which may then be fed to an oscillator circuit for frequency multiplication).

According to the present disclosure, an oscillator circuit may include: a plurality of injection amplifiers configured to receive a plurality of driving signals for inducing a generation of an oscillator signal; a tank circuit configured to generate the oscillator signal based on the plurality of driving signals; an amplifier circuit coupled with the tank circuit and configured to compensate for an energy loss of the tank circuit, the amplifier circuit being interposed between output nodes of the plurality of injection amplifiers and input nodes of the tank circuit such that the plurality of injection amplifiers are indirectly coupled with the tank circuit.

The adapted oscillator circuit described herein may thus include a plurality of injection amplifiers that are coupled with a tank circuit in such a way that the injection amplifiers do not load the tank circuit directly. This configuration greatly reduces the impact of parasitic capacitances on the frequency, and improves the noise performance of the oscillator circuit. The adapted oscillator circuit may illustratively have a configuration in which the injection amplifiers are indirectly coupled with the tank circuit, with an amplification circuit disposed therebetween, which provides the decoupling and thus an indirect transfer of the outputs of the injection amplifiers to the tank circuit.

The signal generator and the oscillator circuit described herein may in general be used independently of one another, e.g. in combination with other circuits. As an example, the multi-phase signal generator may be part of a beamforming circuit, and the oscillator circuit may be used in combination with a signal generator with a different configuration with respect to the adapted scheme described herein. Illustratively, the signal generator and the oscillator circuit already provide the respective advantageous properties in view of the individual adapted configuration. However, in a particularly advantageous configuration, the signal generator and the oscillator circuit are used in combination with one another to provide a multi-phase local oscillator that combines the respective beneficial characteristics. The present disclosure may thus also be directed to a system including the adapted signal generator coupled with the adapted oscillator circuit (e.g., with a plurality of adapted oscillator circuits) to provide the generated multi-phase signal as input signal to the oscillator circuit and generate a corresponding multi-phase oscillator signal.

In the following, particular reference may be made to applications of the adapted signal generator, oscillator circuit, and multi-phase local oscillator for radio communication, e.g. for use in a wireless communication device. In particular, particular reference may be made to the use of the signal generator, oscillator circuit, and multi-phase local oscillator in the context of millimeter-Wave (mmWave) communication. In an exemplary configuration, the adapted multiple-phase signal generation scheme may provide effectively generating 8 (or more) mmWave signal phases with a pre-defined and programmable relation between them, with very good harmonic suppression and fine resolution to allow for phase correction at the transmitter side of a wireless communication device. The octa-phase signal generation scheme may allow obtaining a very efficient mmWave digital power amplifier, which may find application in the next generation of mmWave-WiFi. As another example, the adapted scheme may be used to drive an octa-phase 8-path filter for a high interference tolerant mmWave receiver.

The application of the adapted signal generator, oscillator circuit, and multi-phase local oscillator in radio communication (in particular mmWave communication, for example for 5G, 6G, and beyond) may be the most relevant use case, since the adapted scheme allows satisfying low power requirements, while maintaining a very clean spectral output, which is of particular importance in the context of the continuous miniaturization of wireless communication devices and transceiver circuits. It is however understood that, in general, the signal generator, oscillator circuit, and multi-phase local oscillator described herein may be applied in any type of device or system making use of a multi-phase signal or multi-phase oscillator signal. Other exemplary applications may include radar detection, frequency synthesis, chip-to-chip communication, and the like.

FIG. 1 shows an exemplary wireless communication device 100 in a schematic representation according to the present disclosure. In general, a wireless communication device 100 may include an antenna system 102 (also referred to herein as antenna circuit), transceiver system 104 (also referred to herein as transceiver circuit), and a processing system 106 (also referred to herein as signal processing circuit). In the following a description of exemplary components for the various portions 102, 104, 106 of the wireless communication device 100 will be provided.

It is understood that the configuration illustrated in FIG. 1 is exemplary, and a wireless communication device 100 may include additional, less, or alternative components with respect to those shown. As examples, the wireless communication device 100 may include one or more additional hardware and/or software components depending on its configuration and its intended use, such as processors/microprocessors, controllers/microcontrollers, other specialty or generic hardware/processors/circuits, peripheral device(s), power supply, external device interface(s), subscriber identity module(s) (SIMs), user input/output devices (display(s), keypad(s), touchscreen(s), speaker(s), external button(s), camera(s), microphone(s), etc.), or other related components.

The wireless communication device 100 may be configured to transmit and/or receive radio frequency signals via the antenna system 102, which may include one or more directional or omnidirectional antennas 108, e.g. a single antenna 108 or one or more antenna arrays that include multiple antennas 108. The one or more antennas 108 may include, for example, dipole antennas, monopole antennas, patch antennas, loop antennas, microstrip antennas, or other types of antennas suitable for transmission of radio frequency signals. As an exemplary configuration, an antenna 108 may have multiple apertures, each of which may be considered as an antenna. In an exemplary configuration, the antenna system 102 may additionally include analog antenna combination and/or beamforming circuitry.

Transceiver system 104 may include one or more radio frequency (RF) transceivers 110, each having a receive (RX) path and a transmit (TX) path. Illustratively, the transceiver system 104 may include a transceiver chain 110 for each antenna 108. In general, a RF transceiver may include: an amplification circuit 114 configured to amplify a signal received at the corresponding antenna 108 or a signal to be transmitted via the corresponding antenna 108; a frequency conversion circuit 116 configured to down-convert the frequency of a signal received at the corresponding antenna 108 (e.g., from radio frequency to baseband frequency), and/or configured to up-convert the frequency of a signal to be transmitted via the corresponding antenna 108 (e.g., from baseband frequency to radio frequency); and a filtering circuit 118 configured to operate at a predefined frequency or in a predefined frequency range for selecting signals having a desired frequency for transmission or reception.

The RF transceivers 110 may include analog and digital reception components including amplifiers (e.g., Low Noise Amplifiers (LNAs) and/or Power Amplifiers (PAs)), filters, RF demodulators (e.g., RF IQ demodulators), and analog-to-digital converters (ADCs), which RF transceivers 110 may utilize to convert radio frequency signals to digital baseband samples. In the receive (RX) path, a RF transceiver 110 may be configured to receive analog radio frequency signals from the antenna system 102 and perform analog and digital RF front-end processing on the analog radio frequency signals to produce digital baseband samples (e.g., In-Phase/Quadrature (IQ) samples). In the transmit (TX) path, a RF transceiver 110 may be configured to receive digital baseband samples from the processing system 106 (e.g., from a baseband modem 112 of the processing system 106) and perform analog and digital RF front-end processing on the digital baseband samples to produce analog radio frequency signals to deliver to the antenna system 102 for wireless transmission. A RF transceiver 110 may thus include analog and digital transmission components, which the RF transceiver 110 may utilize to mix the digital baseband samples received from the processing system 106 and produce the analog radio frequency signals for wireless transmission by the antenna system 102.

The processing system 106 may be configured for transmission and reception processing. The processing system 106 may include, for example, a baseband modem 112 (e.g., including a digital signal processor 120 and a protocol controller 122), an application processor 124, and a memory 126. The baseband modem 112 may be configured to direct the communication functionality of wireless communication device 100 according to the communication protocols associated with each (radio) access network, and may be configured to execute control over antenna system 102 and RF transceiver 110 to transmit and receive radio signals according to the formatting and scheduling parameters defined by each communication protocol.

The baseband modem 112 may include a digital signal processor 120, which may be configured to perform physical layer (PHY, Layer 1) transmission and reception processing to, in the transmit path, prepare outgoing transmit data that the protocol controller 122 provides for transmission via RF transceivers 110, and, in the receive path, prepare incoming received data that the RF transceiver 110 provides for processing by the protocol controller 122. Digital signal processor 120 may be configured to perform one or more of error detection, forward error correction encoding/decoding, channel coding and interleaving, channel modulation/demodulation, physical channel mapping, radio measurement and search, frequency and time synchronization, antenna diversity processing, power control and weighting, rate matching/de-matching, retransmission processing, interference cancellation, and any other physical layer processing functions.

The wireless communication device 100 may be configured to operate according to one or more radio communication technologies, and the digital signal processor 120 may be responsible for lower-layer processing functions (e.g., PHY, Layer 1) of the radio communication technologies, while the protocol controller 122 may be responsible for upper-layer protocol stack functions (e.g., Data Link Layer/Layer 2 and/or Network Layer/Layer 3). Protocol controller 122 may thus be responsible for controlling the radio communication components of wireless communication device 100 (antenna system 102, RF transceivers 110, and digital signal processor 120) in accordance with the communication protocols of each supported radio communication technology, and accordingly may represent the Access Stratum and Non-Access Stratum (NAS) (also encompassing Layer 2 and Layer 3) of each supported radio communication technology. Protocol controller 122 may be configured to perform both user-plane and control-plane functions to facilitate the transfer of application layer data to and from radio wireless communication device 100 according to the specific protocols of the supported radio communication technology. User-plane functions may include header compression and encapsulation, security, error checking and correction, channel multiplexing, scheduling and priority, while control-plane functions may include setup and maintenance of radio bearers.

In an exemplary configuration, wireless communication device 100 may be configured to transmit and receive data according to multiple radio communication technologies. Accordingly, one or more of antenna system 102, RF transceivers 110, digital signal processor 120, and/or protocol controller 122 may include separate components or instances dedicated to different radio communication technologies and/or unified components that are shared between different radio communication technologies. Accordingly, while antenna system 102, RF transceivers 110, digital signal processor 120, and protocol controller 122 are shown as individual components in FIG. 1, it is understood that they may encompass separate components dedicated to different radio communication technologies.

The processing system 106 may further include an application processor 124 (e.g., a CPU) and a memory 126. Application processor 124 may be configured to handle the layers above the protocol stack, including the transport and application layers. Application processor 126 may be configured to execute various applications and/or programs of wireless communication device 100 at an application layer of wireless communication device 100, such as an operating system (OS), a user interface (UI) for supporting user interaction, and/or various user applications. The application processor 126 may interface with baseband modem 112 and act as a source (in the transmit path) and a sink (in the receive path) for user data, such as voice data, audio/video/image data, messaging data, application data, basic Internet/web access data, etc. Memory 126 may embody a memory component of wireless communication device 100, such as a hard drive or another permanent memory device. Although not explicitly depicted in FIG. 1, the various other components of wireless communication device 100 may additionally each include integrated permanent and/or non-permanent memory components, such as for storing software program code, buffering data, etc.

The wireless communication device 100, e.g. as part of the one or more transceivers 110, may include one or more local oscillators, configured to generate oscillator signals that the transceivers 110 may use to implement the various functionalities of the amplification circuit 114, frequency conversion circuit 116, and/or filtering circuit 118. According to the present disclosure, the wireless communication device 100, e.g. as part of the one or more transceivers 110, may include one or more multi-phase local oscillators configured to provide multi-phase oscillator signals at a desired frequency, e.g. in the mmWave frequency range.

Figure 2:
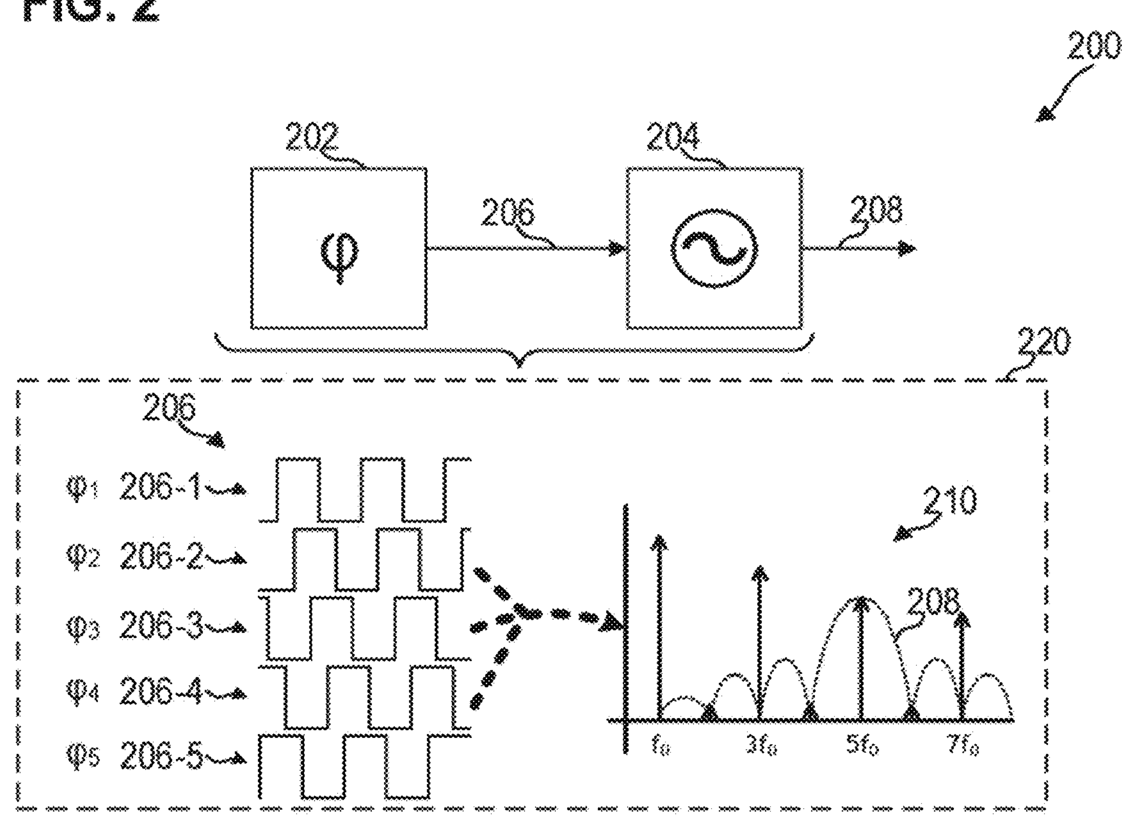
FIG. 2 shows an exemplary multi-phase local oscillator in a schematic view, according to the present disclosure.

FIG. 2 shows an exemplary local oscillator 200 in a schematic view according to the present disclosure. The description in relation to FIG. 2 provides a general introduction to the functioning and application of a local oscillator 200 including an oscillator circuit 204 fed with a multi-phase signal 206 to introduce aspects relevant for the present disclosure. The adapted configuration of a multi-phase local oscillator, signal generator, and oscillation circuit will be described in further detail in relation to FIG. 3A to FIG. 6B.

The local oscillator 200 may include a signal generator 202 configured to generate a multi-phase signal 206, and an oscillator circuit 204 configured to receive the multi-phase signal 206 and provide, as output, an oscillator signal 208. As shown in the inset 220, the multi-phase signal 206 may include a plurality of phase-shifted signals 206-1, 206-2, 206-3, 206-4, 206-5 at a phase offset with respect to one another. Illustratively, each phase-shifted signal 206-1 . . . 206-5 may have a respective phase $\varphi_1$-$\varphi_5$, and a phase difference between the phases of two phase-shifted signals may correspond to the phase offset (in case of adjacent, consecutive, phase-shifted signals) or to a multiple of the phase offset. In the following, references to a multi-phase signal 206 may apply in a corresponding manner to the plurality of phase-shifted signals 206-1 . . . 206-5.

The multi-phase signal 206 is injected to the oscillator circuit 204 to provide a desired frequency multiplication. Illustratively, the phase-shifted signals 206-1 . . . 206-5 may each have an initial (lower) frequency $f_0$ that is a sub-harmonic of the desired frequency for the oscillator signal 208. Frequency multiplication of such initial frequency $f_0$ may be achieved by the phase-shifted signals 206-1 . . . 206-5 having a predefined phase offset with respect to one another, the phase offset being selected in accordance with the frequency multiplication that the oscillator circuit 204 should provide. The oscillator circuit 204 may thus be configured to provide frequency multiplication, e.g. may be configured to receive input signal(s) at an input frequency and generate an output signal 208 at an output frequency that is a multiple of the input frequency. Illustratively, the oscillator circuit 204 may be or may be configured as a frequency multiplier, e.g. an injection-locked frequency multiplier.

In general, to achieve a frequency multiplication by a factor M to provide an oscillator frequency $f_{LO}$ for the oscillator signal 208 (with $f_{LO}$=M*$f_0$), the signal generator 202 may be configured to generate a multi-phase signal 206 including phase-shifted signals equally spaced at a phase offset $\Delta\varphi=2\pi/M$ with respect to one another. Such phase offset may provide that the sub-harmonic phase shifted signals 206-1 . . . 206-5 combine constructively at the desired M-th harmonic frequency $f_{LO}$, and combine destructively at the other harmonics of the initial frequency $f_0$. In general, M may be an integer number. In an exemplary configuration, the signal generator 202 may be configured to generate a multi-phase signal 206 including a number N of phase-shifted signals 206-1 . . . 206-5 corresponding to the multiplication factor M.

The oscillator circuit 204 may thus be configured to generate an oscillator signal 208 based on the multi-phase signal 206, the oscillator signal 208 having a frequency $f_{LO}$ that is a (integer) multiple of the frequency of the multi-phase signal 206 $f_0$. The oscillator circuit 204 may be configured such that the desired harmonic is enhanced with respect to the other undesired harmonics, e.g. may be configured such that a signal component of the oscillator signal 208 at the predefined frequency $f_{LO}$ is greater than the signal components of the oscillator signal 208 at other frequencies, e.g. at least 50% greater (for example in terms of amplitude), or at least 75% greater, or at least 90% greater, as examples. Illustratively, the oscillator circuit 204 may be configured to resonate at the M-th harmonic of the input frequency $f_0$, to generate the oscillator signal 208 at the output frequency $f_{LO}$=M*$f_0$.

In a particularly advantageous configuration in terms of cancellation of undesired harmonics, the multiplication factor M may be an odd integer. Illustratively, the suppression of undesired harmonics may work more efficiently in case the desired harmonic is odd. In the exemplary scenario in FIG. 2, as shown in the frequency spectrum 210, the phase-shifted signals 206-1 . . . 206-5 may have an initial frequency $f_0$ that is a sub-harmonic of the desired frequency for the oscillator signal 208, and the phase offset of the phase-shifted signals 206-1 . . . 206-5 may be selected to provide a constructive combination at the fifth harmonic of the initial frequency, $5f_0$, which may be an odd integer that provides a particularly efficient cancellation of the other harmonics.

The constructive combination may thus provide that the signal component of the oscillator signal 208 at the $5^{th}$ harmonic is greater than the signal components of the oscillator signal at the other frequencies (e.g., at the second harmonic, $2f_0$, third harmonic, $3f_0$, etc.). The signal generator 202 may thus be configured to provide (e.g., to select) a phase offset (illustratively, the phase shift) of the phase-shifted signals that causes a destructive interference at the undesired harmonics, and causes a constructive interference at the desired M-th harmonic.

In this exemplary configuration, the phase-shifted signals may be at a phase offset $\Delta\varphi$ of $2\pi/5$ with respect to one another, so that the phase of a first phase-shifted signal 206-1 may be, as a numerical example, 0°, the phase of a second phase-shifted signal 206-2 may be 72°, the phase of a third phase-shifted signal 206-3 may be 144°, etc.

In an exemplary configuration, the multi-phase signal 206 (and correspondingly, the oscillator signal 208) may include in-phase (I) and quadrature (Q) signal components, e.g. signal components at a phase shift of 90° with respect to one another. Illustratively, the multi-phase signal 206 may include a first plurality of in-phase phase-shifted signals and a second plurality of quadrature phase-shifted signals, and an in-phase phase-shifted signal may be shifted by 90° with respect to the corresponding quadrature phase-shifted signal. Considering the exemplary scenario in FIG. 2, as mentioned above the phase-shifted signals may have phases 0°, 72°, 144°, 216°, etc., and corresponding quadrature components may have phases 90°, 162°, 234°, 306°, etc. In this scenario, the oscillator signal 208 may also include an in-phase component and a quadrature component oscillating at the oscillator frequency $f_{LO}$.

In general, the phase-shifted signals 206-1 . . . 206-5 may have a square-like waveform (illustratively, a squarish waveform) to provide an accurate constructive or destructive combination, and thus enable the desired enhancement of a harmonic and suppression of other harmonics. As an example, the phase-shifted signals 206-1 . . . 206-5 may have a square-waveform, or a rectangular-waveform. It is however understood that the phase-shifted signals may also have other types of waveform, although providing a frequency multiplication with a frequency spectrum possibly including some undesired components.

With respect to other frequency-multiplication techniques, the multi-phase signal injection provides a cleaner output spectrum, e.g. a more efficient cancellation of signal components at the undesired harmonic frequencies. In an exemplary implementation of the multi-phase signal injection, the signal generator 202 may include a plurality of digital-to-time converters (DTCs) each configured to provide a respective phase-shifted signal from a digital control signal for injection in the oscillator circuit 204. Such configuration is however not easily scalable, as it requires a large number of digital-to-time converters (DTCs) to achieve a fine granularity in the possible phases that may be generated. For example, it may be beneficial to have a fine adjustment on the phases of the multi-phase signal 206, e.g. to compensate for non-idealities in the oscillator circuit.

The present disclosure may thus be related to an adapted configuration for a multi-phase local oscillator that allows for multiple phase generation (e.g., in mmWave frequencies) with a reduced number of components, thus providing a cost- and space-efficient approach, e.g. for use in wireless communication devices. In particular, the adapted configuration described herein may include a multi-phase signal generator (see FIG. 3A to FIG. 3E) including a sequence of interpolator layers, and an oscillator circuit (see FIG. 5A to FIG. 5C) in which the input multi-phase signal is not directly injected into the tank circuit.

Figure 3A:
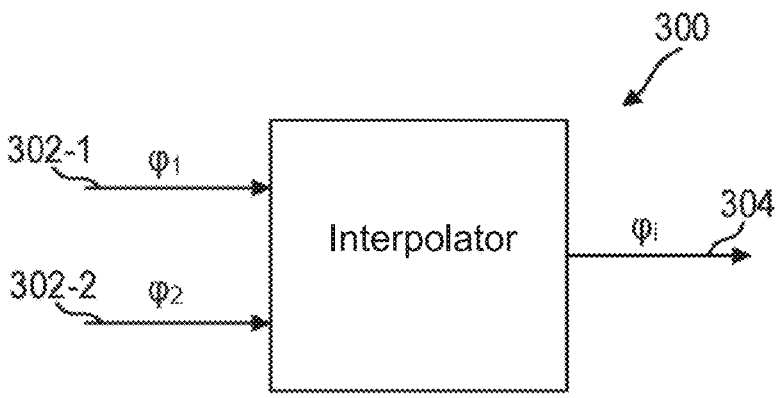
FIG. 3A shows an exemplary interpolator in a schematic view, according to the present disclosure.

FIG. 3A shows an exemplary phase interpolator 300 in a schematic representation according to the present disclosure. The signal generation approach described herein may be based on the realization that successive phase interpolations allow to control the phases of the final output signals (illustratively, the phase-shifted signals, e.g. then injected to an oscillator circuit) with a high resolution without the need for a high number of components. FIG. 3A (and similarly FIG. 3B and FIG. 3C) describes thus a building block of the adapted signal generator that will be described in further detail in relation to FIG. 3D and FIG. 3E. A phase interpolator may also be referred to herein simply as interpolator.

The interpolator 300 may be configured to receive a plurality of input signals 302 each having a respective phase. In a simple configuration, as shown in FIG. 3A, the interpolator 300 may be configured to receive a first input signal 302-1 having a first phase $\varphi_1$ and a second input signal 302-2 having a second phase $\varphi_2$. The second phase $\varphi_2$ may be different from the first phase $\varphi_1$. Illustratively, the first input signal 302-1 and the second input signal 302-2 may be at a phase offset $\Delta\varphi$ with respect to one another. The interpolator 300 may be configured to provide (e.g., to deliver, or to generate), as output signal, an interpolated signal 304 having a phase $\varphi_i$ corresponding to an interpolation of the phases of the input signals 302 (e.g., a phase $\varphi_i$ based on an interpolation of the first phase $\varphi_1$ and the second phase $\varphi_2$ in the exemplary configuration in FIG. 3A). The interpolated signal 304 may thus have an interpolated phase $\varphi_i$ that is an intermediate phase with respect to $\varphi_1$ and $\varphi_2$.

The interpolator 300 may be configured to assign a respective interpolation coefficient to each input signal, e.g. may be configured to associate a first interpolation coefficient to the first input signal 302-1 and a second interpolation coefficient to the second input signal 302-2 in the configuration of FIG. 3A. The interpolation coefficient corresponding to an input signal may represent or define the weight of that input signal in the interpolation, and thus the interpolation coefficient may represent or define the contribution of the phase of that input signal to the phase of the interpolated signal 304. The interpolator 300 may thus be configured to use the respective interpolation coefficient of an input signal for the interpolation.

For example, the interpolation coefficients may be complementary to one another with respect to an interpolation factor $\alpha$. Considering the scenario in FIG. 3A, the sum of the first interpolation coefficient and the second interpolation coefficient may be equal to the interpolation factor $\alpha$. Illustratively, indicating with $\alpha_1$ the interpolation coefficient corresponding to the first input signal 302-1 and with $\alpha_2$ the interpolation coefficient corresponding to the second input signal 302-2, the interpolation coefficients may be in a relationship with one another such that $\alpha_1+\alpha_2=\alpha$. Each interpolation coefficient may thus be in a range from 0 to $\alpha$. The phase $\varphi_i$ of the interpolated signal may thus be expressed as $$\varphi_i = \frac{\alpha_i}{\alpha}\varphi_1 + \frac{\alpha_2}{\alpha}\varphi_2 = \frac{\alpha_1}{\alpha}\varphi_1 + \frac{\alpha-\alpha_1}{\alpha}\varphi_2.$$

In general, the interpolator 300 may be in one of a plurality of possible phase states, and may be configured to generate the interpolated signal 304 as an interpolation of the input signals 302-1, 302-2 based on a selected (illustratively, current or actual) phase state of the plurality of phase states. Each phase state may define respective interpolation coefficients for the input signals 302-1, 302-2. Illustratively, each phase state may be associated with respective interpolation coefficients for the input signals 302-1, 302-2, so that upon selection of the phase state the interpolator 300 may carry out the interpolation of the input signals 302-1, 302-2 using these interpolation coefficients.

In an exemplary configuration, the interpolator 300 may be configured to receive a control signal representative of one of the phase states of the interpolator 300 (illustratively, a control signal representative of interpolation coefficients to be selected for the interpolation of the input signals). The interpolator 300 may be configured to carry out the interpolation of the input signals in accordance with the received control signal, e.g. the interpolator 300 may be configured to assign interpolation coefficients to the input signals corresponding to the phase state (or interpolation coefficients) that the control signal indicates or represents. In an exemplary configuration, the interpolator 300 may thus be understood as a digital-to-time converter, configured to convert a digital control signal (e.g., a signal encoding data) into a corresponding temporal signal (illustratively, the interpolated signal 304 with phase as selected via the digital control signal).

In an exemplary configuration, the interpolation factor $\alpha$ may be equal to 1. In this scenario, the interpolation coefficients assigned to the input signals 302-1, 302-2 may thus have a value in a range from 0 to 1. Selecting a certain phase state (illustratively, selecting certain interpolation coefficients) may thus be understood as selecting a percentage contribution of the input signals to the interpolated signals. Considering the scenario with two input signals 302-1, 302-2, an interpolation factor of 0 would correspond to the phase of that signal not contributing to the phase of the interpolated signal 304, whereas an interpolation factor of 1 would correspond to the phase of that signal as being the sole contribution to the phase of the interpolated signal. Intermediate values of the interpolation factors would define intermediate contributions of the phases of the input signals to the phase of the interpolated signal 304.

In an exemplary configuration, which has been found to provide a compact, yet suitable implementation of the approach described herein, the interpolator 300 may be a 1.5 bit-interpolator. The 1.5 bit-interpolator may have three possible states, corresponding to three possible interpolations of the phases of the input signals. A first state may have interpolation coefficients $\alpha_1=1$, $\alpha_2=0$, so that the phase of the interpolated signal corresponds to the phase of the first input signal. A second state may have interpolation coefficients $\alpha_1=0$, $\alpha_2=1$, so that the phase of the interpolated signal corresponds to the phase of the second input signal. A third state may have interpolation coefficients $\alpha_1=0.5$, $\alpha_2=0.5$, so that the phase of the interpolated signal corresponds to the average of the first phase and the second phase. For example, considering as input signals an in-phase signal and a quadrature signal, the three states may correspond to a phase of the interpolated signal of 0°, 90°, and 45°, respectively.

In general, the functions of the interpolator 300 may be implemented in the analog domain or in the digital domain, e.g. the interpolator 300 may be a digital interpolator or an analog interpolator. An analog implementation may provide a simpler configuration and a simpler integration in a wireless communication device. Various configurations exist in the art for analog phase interpolators, and may in general be based on combining the input waveforms with weighted currents in accordance with the interpolation coefficients of the input signals.

Figure 3B:
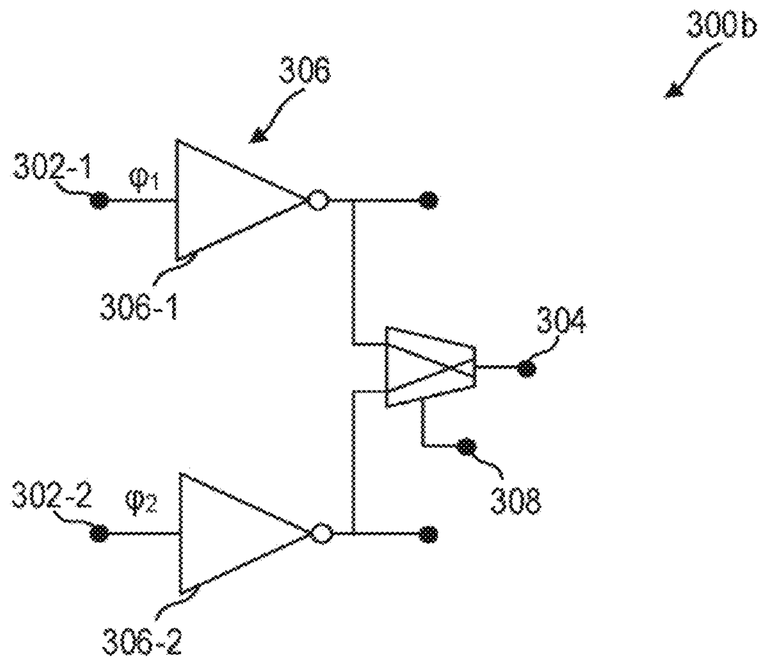
FIG. 3B shows an exemplary block diagram of an interpolator in a schematic view, according to the present disclosure.

FIG. 3B shows an exemplary block diagram of an analog phase interpolator 300*b* in a schematic view, according to the present disclosure. The block diagram is presented, without limitation, as a basic exemplary implementation of the phase interpolator 300. It is however understood that many possible configurations for implementing phase interpolation of input signals exist, and are in general known in the art. Other exemplary configurations may include delay elements, e.g. in a matrix configuration or staggered configuration.

In the basic architecture in FIG. 3B, the interpolator 300*b* may include a plurality of inverters 306, e.g. a first inverter 306-1 and a second inverter 306-2 considering two input signals 302-1, 302-2. The outputs of the inverters 306-1, 306-2 may be combined with one another, illustratively the outputs of the inverters 306-1, 306-2 may be shorted. The interpolator 300*b* may be configured to receive a control signal 308 defining the interpolation coefficients for the two input signals 302-1, 302-2. As an example, the two input signals 302-1, 302-2 may be or may include a current, and the control signal 308 may define how the currents are combined to provide the output signal 304. Illustratively, the control signal 308 may define the weight (e.g., the contribution) of each current to the output signal 304. At the output, the analog phase interpolator 300*b* may further include a load and/or a plurality of capacitors that are differentially charged and discharged to transform the resulting current into an output voltage (illustratively corresponding to the interpolated signal 304).

Figure 3C:
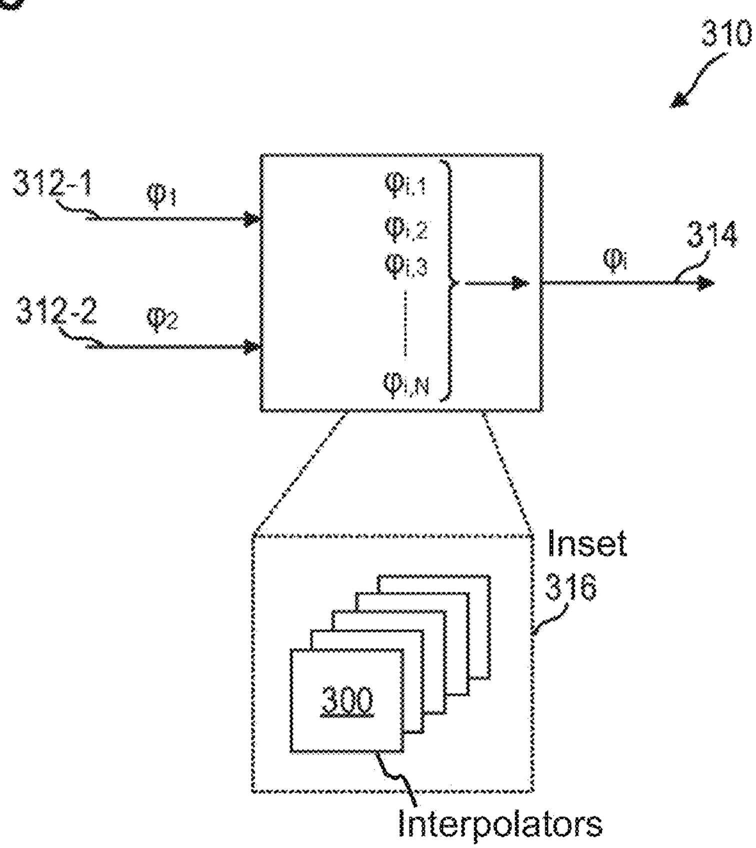
FIG. 3C shows an exemplary interpolator in a schematic view, according to the present disclosure.

A more advanced configuration of a phase interpolator 310 is shown in FIG. 3C. The interpolator 300 described in FIG. 3A may provide limited flexibility in terms of phase of the output signal, and the interpolator 310 in FIG. 3C may be configured to provide additional tunability for the selection of the output phase $\varphi_i$.

The interpolator 310 may be configured to receive a plurality of input signals each with a respective phase, e.g. a first input signal 312-1 having a first phase $\varphi_1$ and a second input signal 312-2 having a second phase $\varphi_2$ different from the first phase, as described for the interpolator 300. The interpolator 310 may be further configured to generate a plurality of interpolated signals based on a plurality of interpolations of the input signals (e.g., a plurality of interpolations of the first input signal 312-1 with the second input signal 312-2). Each interpolated signal may have a respective phase $\varphi_{i,1}$-$\varphi_{i,N}$ based on the respective interpolation of the phases of the input signals (e.g., based on the respective interpolation of the first phase with the second phase). The interpolator 310 may be further configured to combine the interpolated signals with one another to provide (e.g., to generate, or to deliver) an output signal 314.

The operation of the interpolator 310 may thus be divided into two stages. In a first stage, the interpolator 310 may be configured to carry out a plurality of interpolations of the input signals 312-1, 312-2. In a second stage, the interpolator 310 may be configured to combine (e.g., to sum) all the results of the plurality of interpolations to generate the output signal 314. The resulting phase of the output signal 314 may thus be defined by the interpolation coefficients used for the plurality of interpolations, and by the combination of the resulting interpolated signals. The interpolator 310 may be configured to combine the interpolated signals in a parallel fashion, e.g. the combination may be a parallel combination (e.g., a parallel sum) of the plurality of interpolated signals. In an exemplary configuration, considering an analog implementation, the interpolator 310 may be configured to sum, in parallel, the resulting currents for each interpolation to generate the output signal 314.

Generating a plurality of interpolated signals and then combining them may increase the degrees of freedom available to define the phase epi of the output signal 314. Illustratively, adjusting the interpolation coefficients of an interpolation modifies the phase of the resulting interpolated signal, and thus the phase of the output signal 314 resulting from the combination, with a finer resolution compared to the basic configuration of FIG. 3A. In an exemplary configuration, the interpolator 310 may be configured to receive a (e.g., digital) control signal representative of the interpolation coefficients of each of the plurality of interpolations, and may be configured to carry out the plurality of interpolations using the interpolation coefficients that the control signal indicates.

As shown in the inset 316, in an exemplary configuration, the interpolator 310 may include a plurality of interpolator instances, e.g. a plurality of interpolator 300 (configured as described in FIG. 3A), each configured to carry out a respective interpolation of the plurality of interpolations. The interpolators 300 may be coupled in parallel with one another, illustratively the respective outputs of the interpolator instances may be shorted, so as to provide a parallel combination (e.g., a parallel sum) of the respective interpolated signals. As an example, the interpolator 310 may include a plurality of 1.5 bit interpolators, each configured to provide a respective interpolation according to a selected phase state.

Considering a number N of interpolator instances (e.g., a number N of 1.5 bit interpolators), the interpolator 310 may have a number N+1 of possible phase states, e.g. a number N+1 of possible phases $\varphi_i$ for the output signal 314. Selecting one phase state may provide selecting the phase of the output signal 314 from the group of phases [90° *0/(N+1), 90° *1/(N+1), . . . , 90° *N+1/(N+1)], thus allowing a broader choice of possible phases for the output signal 314.

The interpolator 310 may thus provide controlling the phase of the output signal 314 with a relatively fine resolution. A possible "brute force" approach to generate a multi-phase signal (e.g., a possible "brute force" implementation of the signal generator 202) may thus include using a plurality of interpolators 310. To simultaneously generate a plurality of N+1 phases covering 0 to 90° with the specified resolution N (thermometric) while using the brute force method, the signal generator may include a number N+1 of interpolators 310, and thus a number (N+1)*N of interpolator instances (e.g., (N+1)*N 1.5 bit interpolators), to achieve a resolution of 90°/(N+1) and N+1 simultaneous (illustratively, concurrent) output phases.

The "brute force" approach may however be not easily scalable. Considering an exemplary numerical example, and assuming a desired resolution of less than 0.9° a simple calculation shows that a number N=100 of interpolators 310, and thus 10100 interpolator instances (e.g., 10100 1.5 bit interpolators) would be required. Considering a simpler scenario without a continuous coverage while maintaining the same resolution, the number may be slightly lowered. For example, in case of 0.9° resolution to cover all impairments but only surrounding 9° increments [0°, 0.9°, 8.1°, 9°, 9.9°, . . . , 90°], still (100+1)*10=1010 interpolator instances (e.g., basic 1.5 bit cells) may be needed.

This simple numerical example shows that a "brute force" method is highly inefficient, since it strongly links resolution and coverage and does not take advantage of the modularity of the basic building block.

The present disclosure is related to a configuration that exploits the modular nature of the basic interpolator building block 300, 310, by providing a sequence of connected interpolator layers, which allows achieving a fine resolution while reducing the number of components by at least one order of magnitude compared to the "brute force" approach. This disclosure offers thus a more efficient and scalable way to generate multi-phase signal generator (e.g., a multi-phase DTC), that may fulfill the requirements posed by an octa-phase generation scheme. In the approach described herein resolution and coverage are separated, thus allowing an additional degree of freedom by using layers of a coarser resolution structure.

Figure 3D:
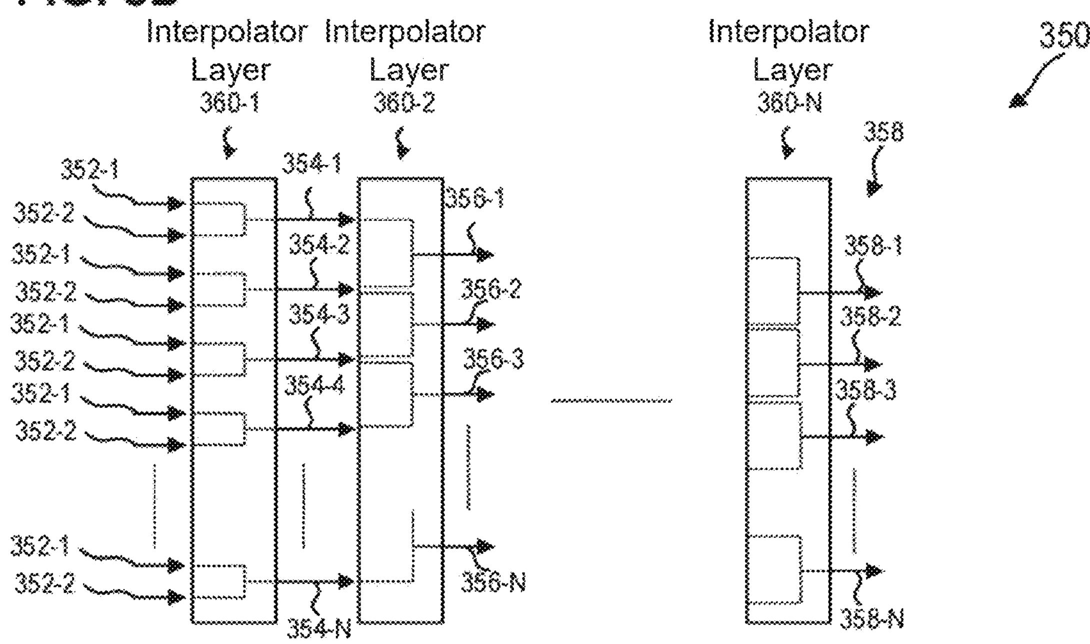
FIG. 3D and FIG. 3E show an exemplary signal generator including a plurality of interpolators in a schematic view, according to the present disclosure.
Figure 3E:
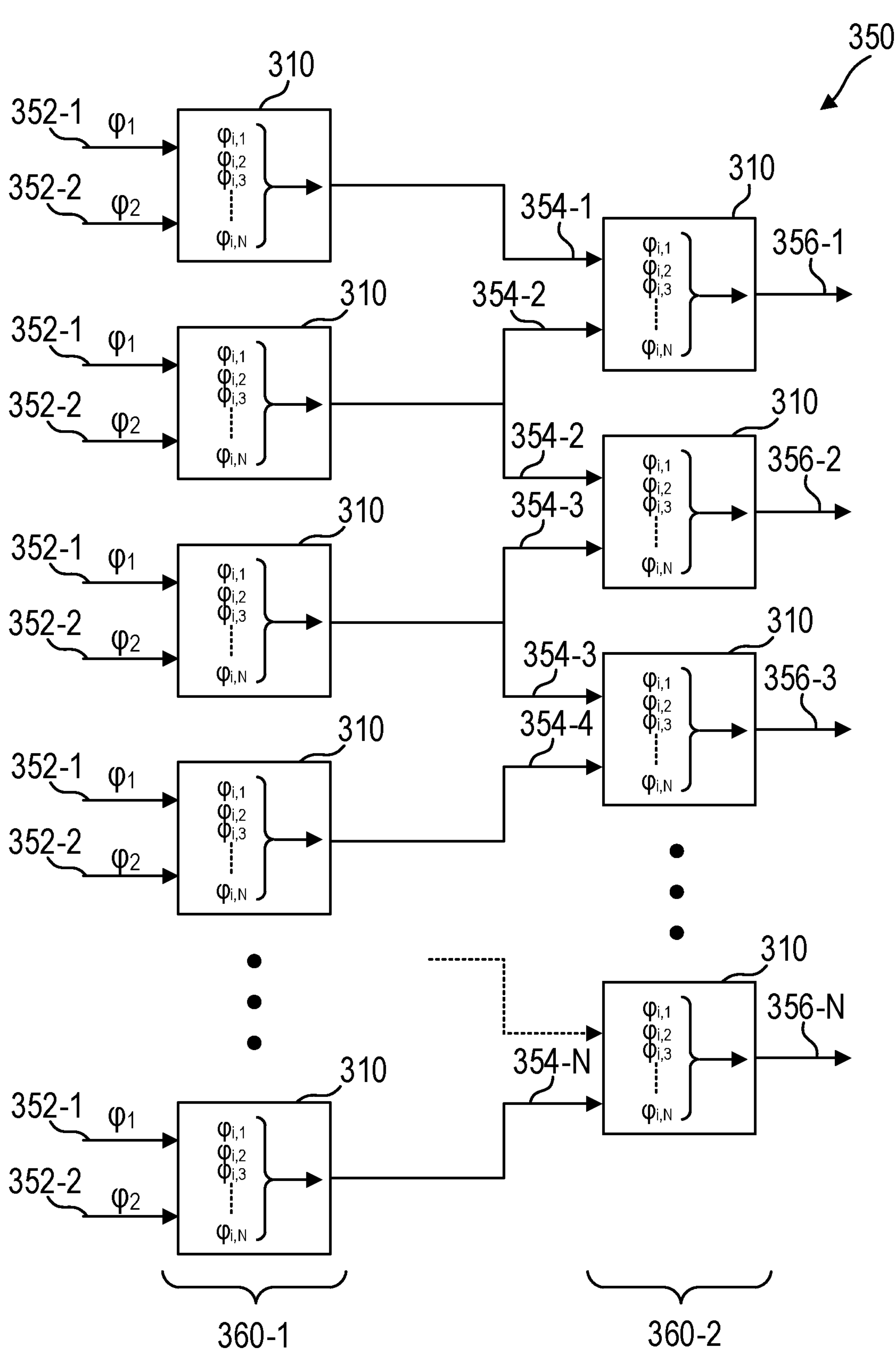

FIG. 3D and FIG. 3E show an exemplary signal generator 350 in a schematic representation, according to the present disclosure. The signal generator 350 may be a multi-phase signal generator configured to generate a multi-phase output signal according to the adapted strategy described herein. The signal generator 350 may be an adapted configuration of the signal generator 202 described in relation to FIG. 2, e.g. for use in combination with one or more oscillator circuits, as discussed in further detail below.

The signal generator 350 may include a plurality of interpolators 310 configured as described in relation to FIG. 3C. Illustratively, the signal generator 350 may include a plurality of interpolators 310 each configured to receive a plurality of input signals (e.g., two input signals), generate a plurality of interpolated signals, each with a respective phase, and combine (e.g., sum) the interpolated signals with each other to generate an output signal.

The plurality of interpolators 310 may be illustratively arranged in a plurality of consecutive interpolator layers 360-1 . . . 360-N, in which the interpolators of one layer provide the respective output signals as input signals to the interpolators of the subsequent layer. This arrangement provides thus carrying out a sequence of interpolations to allow a more and more refined control over the resulting phase of the output signals. An initial layer of interpolators may receive, as input signals, reference signals at the desired frequency ($f_0$, e.g. a sub-harmonic of a predefined oscillator frequency), and a final layer of interpolators may provide, as output, the multi-phase signal (illustratively, including the output signals of the interpolators of the final layer).

The operation of the signal generator 350 is schematically illustrated in FIG. 3D. The signal generator 350 may include a plurality of interpolator layers 360-1 . . . 360-N, e.g. at least two interpolator layers, each including a plurality of interpolators. Each interpolator layer 360-1 . . . 360-N may receive a plurality of input signals and may be configured to provide a plurality of output signals, each having a respective phase, via interpolations of the input signals. As shown in FIG. 3D, the output signals 354-1 . . . 354-N of the first layer 360-1 may be fed as input signals to the second layer 360-2. The output signals 356-1 . . . 356-N of the second layer 360-1 may be fed as input signals to a third layer, etc. The signal generator 350 may then provide, as output, a multi-phase output signal 358 including the output signals 358-1 . . . 358-N of the final layer 360-N of interpolators. The configuration with a cascade of interpolator layers 360-1 . . . 360-N allows a fine control over the phases of the multi-phase output signal 358, which may be precisely tuned by controlling the interpolation coefficients of one or more of the plurality of interpolations along the signal path.

In general, the "first" or "initial" layer of interpolators may be the layer of interpolators that receives, as input, reference signals (illustratively, starting signals), e.g. from the outside of the signal generator 350, and does not receive, as input, the output signals of another layer. The "last" or "final" layer of interpolators may be the layer of interpolators that delivers, as output, the multi-phase signal that is delivered towards the outside of the signal generator, and does not provide its output to another layer.

In a simple configuration, which still allows achieving an accurate tuning of the phases, the signal generator 350 may include two layers of interpolators (see FIG. 3E), so that the output signals of the second layer 360-2 may be provided as multi-phase signal towards the outside of the signal generator 350 (e.g., to an oscillator circuit coupled with the signal generator 350). In the following, the description may be focused on a two-layer configuration, but it is understood that the aspects described for the two-layer configuration may apply in a corresponding manner to a configuration of the signal generator 350 with more than two interpolator layers.

As shown in FIG. 3E, the plurality of interpolators 310 may thus be arranged in several (sub-)pluralities of interpolators, e.g. several layers or columns (illustratively, several arrays), for example a first plurality of interpolators 310 (e.g., a first layer 360-1) and a second plurality of interpolators 310 (e.g., a second layer 360-2) in the exemplary configuration in FIG. 3E. The interpolators 310 of the first plurality of interpolators may each be configured to receive as input signals a plurality of reference signals (e.g., as first input signal a first reference signal 352-1 and as second input signal a second reference signal 352-2). The interpolators 310 of the second plurality of interpolators may be configured to receive as input signals a plurality of output signals from the first plurality of interpolators, e.g. each interpolator 310 of the second plurality of interpolators may be configured to receive as first input signal an output signal from an interpolator 310 of the first plurality of interpolators and as second input signal another output signal from another interpolator 310 of the first plurality of interpolators.

By way of illustration, the first layer 360-1 of interpolators 310 may provide a coarse grid of phases, and the second layer 360-2 of interpolators 310 may provide refining the phases of the output signals around the grid points defined by the first layer 360-1. The first layer 306-1 of interpolators 310 may thus define the coverage of the range of the multi-phase signal, and the second layer 360-2 of interpolators 310 may allow tuning the resolution with a fine granularity around the relevant phase points. The interpolators 310 may be configured (in some aspects, operable) such that each output signal has a phase different from the phase of each other output signal of the other interpolators 310.

As discussed in relation to FIG. 3A to FIG. 3C, the output signal of an interpolator 310 may have a phase that has an interpolated value based on the phases of the input signals. Considering a configuration with two input signals 352-1, 352-2, the output signal of an interpolator 310 may thus have a phase in a range delimited by the phases $\varphi_1$, $\varphi_2$ of the two input signals 352-1, 352-2, e.g. a range having as lower limit one of the first phase or the second phase, and as upper limit the other one of the first phase or the second phase. The use of subsequent interpolator layers may provide narrowing the range at each interpolator layer, thus tuning the phase of the subsequent output signal with finer granularity within the narrow(er) range.

The interpolators 310 of one layer may be coupled with the interpolators of the subsequent layer, e.g. an output node or output terminal of an interpolator 310 of the first plurality of interpolators 310 may be coupled with an input node or input terminal of an interpolator 310 of the second plurality of interpolators 310. As shown in FIG. 3D, at least one interpolator 310 of the first plurality of interpolators 310 may be coupled with more than one (e.g., two) interpolators 310 of the second plurality of interpolators. Illustratively, at least one (e.g., more than one, e.g. each) interpolator 310 of the first plurality of interpolators 310 may be configured to provide the respective output signal 354 as input signal to two interpolators 310 of the second plurality of interpolators 310. This configuration may define the phases of the multi-phase signal in consecutive step, as discussed in further detail below, thus providing an accurate control over the phases.

In particular, an interpolator 310 of one layer may be coupled with interpolators 310 of the preceding layer that are adjacent to one another. As shown in FIG. 3D, an interpolator 310 of the second plurality of interpolators 310 may be configured to receive as first input signal and second input signal the respective output signals of interpolators 310 of the first plurality of interpolators 310 that are adjacent to one another. Illustratively, interpolators 310 that are adjacent to one another may include interpolators 310 configured to provide output signals having consecutive phase values, e.g. within the grid defined by the layer of interpolators.

According to the present disclosure, the interpolators 310 may be configured to generate the respective output signal having a phase that is a multiple (or sub-multiple) of a predefined phase. Illustratively, the signal generator 350 may include a number of interpolators 310 according to a phase range to be covered and according to a desired resolution within such range, and the predefined phase may be a unit interval of the phase range to be covered. The predefined phase may define the incremental steps with which the signal generator 350 covers the desired range, e.g. the incremental steps between the phases of the multi-phase signal that the signal generator 350 outputs.

In an exemplary configuration, the initial layer 360-1 of interpolators 310 (illustratively, the first plurality of interpolators) may include a number N of interpolators, and the predefined phase may be inversely proportional to the number N of interpolators 310. Illustratively, the number N of interpolators may define the phase-interval or phase-step between consecutive points in the (coarse) grid defined by the initial layer 360-1 of interpolators 310. As a numerical example, the interpolators 310 of the first plurality of interpolators 310 may be configured such that the respective output signals have a phase that is an integer multiple of $90°/(N+1)$. The output signals of the initial layer 360-1 of interpolators 310 may thus cover a range from 0° to 90° in steps of $90°/(N+1)$. For example, an interpolator 310 may be configured to provide an output signal having a phase multiple of the predefined phase by including a corresponding number of interpolator instances and controlling the respective interpolation coefficients, as discussed in relation to FIG. 3A to FIG. 3C.

As mentioned above, interpolators 310 of the first plurality of interpolators 310 may be configured such that the respective output signals of interpolators 310 that are adjacent to one another have phases that are consecutive integer multiples of the predefined phase. As an example, the output signal 354-1 of a first interpolator 310 may have a phase of 0*predefined phase, the output signal 354-2 of the next (second) interpolator 310 may have a phase of 1*predefined phase, the output signal 354-3 of the next (third) interpolator 310 may have a phase of 2*predefined phase, etc. Illustratively, the interpolators 310 of the first plurality of interpolators 310 may be configured to provide a plurality of output signals with increasing phases, e.g. with increments defined by the predefined phase. Considering again a number N of interpolators for the first plurality of interpolators, the phase difference between the phases of the output signals of adjacent interpolators 310 of the first plurality of interpolators 310 may be inversely proportional to the number N of interpolators, e.g. the phase difference may be 90°/(N+1).

As mentioned above, an interpolator 310 of the subsequent layer 360-2 of interpolators 310 may be configured to receive, as input signals, the output signals of adjacent interpolators 310 of the preceding layer 360-1. An interpolator 310 of the second plurality of interpolators 310 may thus be configured to receive, as input signals, output signals of the first plurality of interpolators 310 having phases that are consecutive integer multiples of the predefined phase.

The interpolators 310 of the second layer 360-2 may thus provide output signals having a phase within a range corresponding to the phase difference between the phases of the output signals of adjacent interpolators 310 of the first plurality of interpolators 310, e.g. within a range having size 90°/(N+1). For example, the output signal 356-1 of a first interpolator 310 of the second layer 360-2 may have a phase in the range from 0 to 90°/(N+1), the output signal 356-2 of a second interpolator 310 of the second layer 360-2 may have a phase in the range from 90°/(N+1) to 2*90°/(N+1), the output signal 356-3 of a third interpolator 310 of the second layer 360-2 may have a phase in the range from 2*90°/(N+1) to 3*90°/(N+1), etc.

By way of illustration, the first layer 360-1 may be configured to generate a basic grid with a coarse resolution and number of phases [90° *0/(N+1), 90° *1/(N+1), 90° *(N+1)/(N+1)], and the second layer 360-2 may be configured to interpolate pairs of adjacent phases from the first layer 360-1 to obtain the same number of phases from the first layer 360-1 but with the ability to perform a very high resolution correction. The output phases of the second layer 360-2 may thus be [(0+K/(N+1))*90°/(N+1), (1+K/(N+1)) *90°/(N+1), (N+K/(N+1))*90°/(N+1)]. The output phases of the second layer 360-2 may thus be spaced similarly to the "brute force" method but can obtain an order of magnitude improvement in resolution with just double the basic building block.

Considering again the above-mentioned numerical example of 0.9° resolution surrounding 9° increments, the adapted configuration of the signal generator 350 may provide achieving such resolution with a number N=10 of interpolators 310 per each layer, each including 10 interpolator instances (e.g., each including 10 1.5 bit interpolators). Considering the two-layer configuration in FIG. 3D, the signal generator 350 may thus include only 20 interpolators 310, resulting in 20*10=200 basic building block, e.g. 200 interpolators 300, which corresponds to an 80% reduction in the number of basic cells used relative to the brute force approach, a dramatic improvement in both power consumption and jitter.

According to the present disclosure the signal generator 350 may include a processor (e.g., a controller) configured to control the interpolators 310. The processor may be configured to control the interpolation coefficients of the plurality of interpolations of one or more interpolators 310 (e.g., of each interpolator 310). The processor may be configured to provide (e.g., to send, or deliver) a respective control signal to one or more interpolators 310 (e.g., to each interpolator 310) to define the interpolation coefficients of the respective plurality of interpolations. In an exemplary configuration, the operation of the signal generator 350 may thus be understood as a multi-phase DTC, in which a digital code leads to the generation of a temporal signal, illustratively a DTC in which a plurality of (digital) control signal lead to the generation of a multi-phase (analog) signal including a plurality of phases. The signal generator 350 may be a multi-phase layered DTC. The processor may be configured to dynamically modify the interpolation coefficients of one or more of the interpolators, e.g. based on a feedback signal representative of the output signals of the last layer of interpolators, e.g. based on a feedback signal representative of non-idealities in an oscillator circuit, and the like.

In other configurations, the control signal(s) for the plurality of interpolators 310 may originate from the outside of the signal generator 350. Illustratively, the signal generator 350 may be configured to receive the control signal from another circuit or device (e.g., from a processing system of a wireless communication device, as an example), and may be configured to control the interpolators 310 according to the received control signal.

As mentioned above, the configuration of the signal generator 350 may be not limited to two layers of interpolators, but may in general include a number N of layers, depending on the desired refinement of the phases of the multi-phase output signal. For example, the signal generator 350 may further include a third plurality of interpolators 310, and each interpolator 310 of the third plurality may be configured to receive as first input signal an output signal from an interpolator 310 of the second plurality of interpolators and as second input signal another output signal from another interpolator 310 of the second plurality of interpolators.

The total number of interpolators 310 and/or the number of interpolators 310 in each layer 360-1, 360-2 may be selected depending on the desired number of phases for the multi-phase output signal, e.g. may be selected depending on the desired number of output signals to be provided to the outside of the signal generator 350. In an exemplary configuration, which may be for use in an octa-phase generation scheme that provides particularly efficient signal amplification, the signal generator 350 may be configured to generate a multi-phase output signal having twenty different phases. Considering in-phase and quadrature signals, this scheme may correspond to a number N=10 of interpolators 310 in the final (e.g., second) layer of interpolators.

It is however understood that many additional variations and degrees of freedom may be considered and tuned to adapt the signal generator 350 to a specific application, e.g. in terms of number of the layers, different degree of interpolators per layer, etc. For example, the interpolators 310 may each include a same number of interpolator instances 300, but in other configurations the number of interpolator instances 300 may vary between interpolators 310 (e.g., at least one interpolator 310 may include a different number of interpolator instances with respect to another interpolator 310).

The reference signals 352-1, 352-2 input to the signal generator 350 may be adapted according to the desired use of the multi-phase output signal. For example, considering coupling with an oscillator circuit (or an array of oscillator circuits), the reference signals 352-1, 352-2 may have a frequency that is a sub-harmonic of an oscillator frequency of the oscillator circuit. As a numerical example, which may provide a particularly efficient frequency multiplication and suppression of undesired harmonics, the reference signals 352-1, 352-2 may have a frequency that is one-fifth of the oscillator frequency $f_{LO}$. In an exemplary configuration, the reference signals 352-1, 352-2 (and correspondingly, the multi-phase output signal) may have a square-like waveform, e.g. a square- or rectangular-waveform, which may provide efficient frequency multiplication/cancellation, as discussed in relation to FIG. 2. As a numerical example, the oscillator frequency may be in the mmWave frequency range.

In an exemplary configuration, the reference signals 352-1, 352-2 input to an interpolator 310 of the first layer 360-1 of interpolators 310 may include an in-phase and a quadrature signal. For example, the first input signal 352-1 may be an in-phase signal, and the second input signal 352-2 may be a quadrature signal. More in general, the first input signal 352-1 and the second input signal 352-2 input to a (e.g., each) interpolator 310 of the first layer 360-1 may have phases that are at a phase offset of 90° with respect to one another. This may allow a convenient generation of the input signals, as well as providing a greater number of input/output phases in a simple manner (illustratively, having one signal it may be relatively straightforward to generate the 90° phase shifter version of the signal).

In an exemplary configuration, the signal generator 350 may include a signal distributor configured to receive a reference signal (e.g., including an in-phase and a quadrature component) and distribute the reference signal to the interpolators 310 of the first plurality of interpolators 310. As an example, the signal distributor may be configured to distribute a current corresponding to the reference signal to the interpolators 310 of the first plurality of interpolators 310.

The reference signals that are input to the signal generator 350 may be generated in any suitable manner capable of providing a controlled frequency and a controlled phase for the reference signals. In general, the signal generator 350 may include or may be coupled with a reference signal generator configured to generate the reference signals at the desired frequency (e.g., at the sub-harmonic frequency of the oscillator frequency). As an example, the reference signal generator may be or may include a phase-locked loop (PLL).

As an illustrative example, in an octa-phase generation scheme, to obtain 8 phases after multiplication by 5 in oscillator circuit(s) the phases to be injected to the oscillator circuit(s) in degrees are: 0°, 9°, 18°, 27°, 72°, 81°, 90°, 99°, 144°, 153°, 162°, 171°, 216°, 225°, 234°, 243°, 288°, 297°, 306°, 315°. The multi-phase layered DTC may be configured to create such 20 (or even more) output phases from input signals at of a fundamental frequency (e.g., desired output LO frequency divided by 5). The multi-phase DTC may thus provide a discrete grid that is determined by the multiplication ratio and the phase ratio required between the phases of the output signal (e.g., the mmWave output signal of the oscillator circuit). The adaptable configuration of the multi-phase DTC allows for calibration and allows taking into account error to obtain low spurs and maintain the relation between the signal phases. The multi-phase DTC provides a significantly better resolution around the discrete grid—typically increased by 1 order of magnitude or more compared to conventional configurations.

FIG. 4 shows a schematic flow diagram of a method 400 of generating a multi-phase signal. In general, the method 400 may include carrying out a sequence of phase interpolations starting from input signals having different phases. Each phase interpolation in the sequence may interpolate output signals of the preceding phase interpolation within the sequence.

The method 400 may include, in 410, carrying out a first plurality of interpolations of a first reference signal having a first phase with a second reference signal having a second phase to provide a first plurality of interpolated signals. Each interpolated signal may have a respective phase based on the respective interpolation of the first phase with the second phase.

The method 400 may further include, in 420, carrying out a second plurality of interpolations, each interpolation of the second plurality of interpolations including interpolating an interpolated signal of the first plurality of interpolated signals with another interpolated signal of the first plurality of interpolated signals to provide a second plurality of interpolated signals. Each interpolated signal of the second plurality of interpolated signals may have a respective phase based on the respective interpolation of the phases of the interpolated signals used for the interpolation.

The method 400 may further include delivering, as output, a multi-phase signal. The multi-phase signal may include the output signals of a final plurality of interpolations (e.g., of the second plurality of interpolations, or a subsequent plurality of interpolations).

In addition to the adapted configuration for a signal generator, the present disclosure is also related to an adapted configuration for an oscillator circuit (e.g., for the oscillator circuit 204), which will be described in further detail in relation to FIG. 5A to FIG. 5C.

Figure 5A:
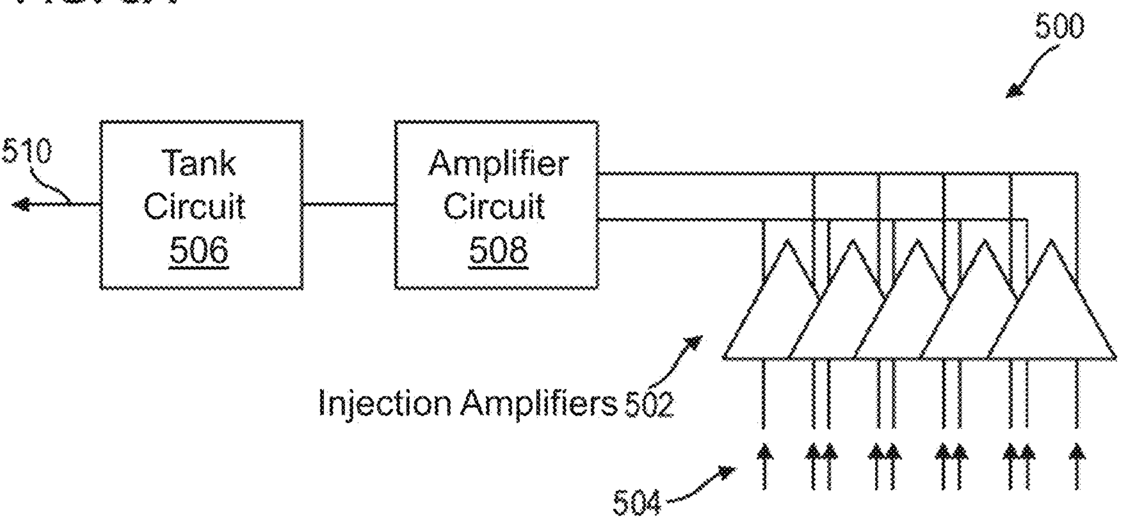
FIG. 5A shows an exemplary oscillator circuit in a schematic view according to the present disclosure.

FIG. 5A shows an oscillator circuit 500 in a schematic representation, according to the present disclosure. The oscillator circuit 500 may be configured to generate an oscillator signal based on a multi-phase input signal. The oscillator circuit 500 may be an adapted configuration of the oscillator circuit 204 described in relation to FIG. 2, e.g. for use in combination with a multi-phase signal generator.

In general, the configuration of an oscillator circuit for generating an oscillator signal, e.g. in the context of injection-locking, may be well-known in the art. Illustratively, suitable hardware components, suitable topology, and suitable operational parameters for generating oscillator signals are well-known in the art, so that the present disclosure does not include a detailed discussion of such aspects, the focus being instead placed on the relevant features of the adapted configuration of the oscillator circuit 500.

The oscillator circuit 500 may include an injection circuit configured to receive a plurality of driving signals 504 for injection into a tank circuit 506 of the oscillator circuit 500. The injection circuit may include a plurality of injection amplifiers 502 configured to receive the plurality of driving signals 504. The driving signals 504 may be for inducing the generation of an oscillator signal 510 at a desired oscillator frequency $f_{LO}$.

In an exemplary configuration, the plurality of driving signals 504 may be or include a multi-phase signal (e.g., output from the signal generator 350). Illustratively, each driving signal may have a respective phase, different from the other driving signals 504, and the phases of the driving signals 504 may provide frequency multiplication at a predefined oscillator frequency $f_{LO}$, as discussed in relation to FIG. 2. The driving signals 504 may be at a phase offset $\Delta\varphi=2\pi/M$ with respect to one another, where M may indicate the harmonic to be amplified in the oscillator circuit 500. As a numerical example M may be an odd integer, such as 5. The driving signals 504 may thus have a frequency that is a sub-harmonic of the frequency of the oscillator signal 510 to be generated, e.g. a frequency $f_0=f_{LO}/M$, e.g. $f_0=f_{LO}/5$. In an exemplary configuration, the oscillator frequency $f_{LO}$ may be in the mmWave frequency range, e.g. the oscillator circuit 500 may be a mmWave oscillator. The oscillator circuit 500 may include a number of injection amplifiers 502 that may be adapted depending on the desired multiplication, e.g. the oscillator circuit 500 may include a number M of injection amplifiers. In an exemplary configuration, the driving signals 504 may include in-phase components and corresponding quadrature components.

The oscillator circuit 500 may further include a tank circuit 506 configured to generate the oscillator signal 510 based on the plurality of (multi-phase) driving signals 504. Illustratively, the tank circuit 510 may be configured such that upon injection of the driving signals 504 into the tank circuit 506, the tank circuit 506 may resonate via injection-locking to generate the output signal 510 at the oscillator frequency $f_{LO}$. In an exemplary configuration, the oscillator signal 510 may have an in-phase component and a quadrature component, e.g. the oscillator circuit 500 may be configured to generate an oscillator signal 510 having two components at a phase offset of 90° with respect to one another (or any other suitable phase offset).

The oscillator circuit 500 may further include an amplifier circuit 508 coupled with the tank circuit 506 and configured to compensate for an energy loss of the tank circuit 506. Illustratively, as known in the art, upon oscillation part of the energy gets lost due to resistive effects, and the amplifier circuit 508 may be configured to provide signal amplification to compensate for such damping losses in the tank circuit 506 (and overall in the oscillator circuit 500). As an example (see also FIG. 5B), the amplifier circuit 508 may include a plurality of transistors to provide a transconductance gain.

In the oscillator circuit 500, the amplifier circuit 508 may be interposed between the injection circuit and the tank circuit 506 so that the injection circuit does not load the tank circuit 506 directly. The amplifier circuit 508 may thus be interposed between an output of the injection amplifiers 502 (e.g., output terminals, or output nodes of the injection amplifiers 502), and an input of the tank circuit 506 (e.g., input terminals, or input nodes). With this configuration, the injection amplifiers 502 may be indirectly coupled with the tank circuit 506. Illustratively, in the adapted configuration of the oscillator circuit 500, a direct coupling between the injection amplifiers 502 and the tank circuit 506 may be absent, so that the signals output from the injection amplifiers 502 propagate first through the amplifier circuit 508, and only afterwards are injected into the tank circuit 506.

The adapted configuration of the oscillator 500 may allow for an increased capacitive loading, thus supporting wide frequency coverage with low power consumption. To better understand the advantageous configuration of the oscillator circuit 500, it may be beneficial to examine the main disadvantage of using a traditional cross-coupled pair topology at high mmW frequencies. In a conventional configuration, the injection amplifiers may be directly coupled with the tank. In this implementation the parasitic capacitance of the injection amplifiers (or drivers) will severely limit the bandwidth and increase power consumption as the multiplication factor increases, since more amplifiers are loading the resonator. The resonator frequency in this configuration may be, $$f = \frac{f_0}{\sqrt{1 + \frac{nC_{par\_amp}}{2C}}},$$

-continued $$\text{where } f_0 = \frac{1}{2\pi\sqrt{LC}},$$

n is the multiplication factor, $C_{par\_amp}$ is the parasitic capacitance of the injection amplifiers, and C is the total capacitance of the oscillator that does not include the amplifiers and the loads. To compensate for the parasitic capacitance, in the conventional configuration with direct load the size of the inductor may be reduced, which will lead to small signal loop gain and amplitude and will also limit frequency coverage and tunability.

In the adapted oscillator circuit 500, on the other hand, the indirect load of the tank circuit 506 allows reducing the effect of the parasitic capacitances of the injection amplifiers 502, thus increasing the flexibility of the circuit while achieving a reduced power consumption. In the following, with relation to FIG. 5B and FIG. 5C, a possible configuration of the oscillator circuit 500 will be described, which has been found to provide a compact implementation of the strategy described herein. It is however understood that other configurations of the amplifier circuit 508 and tank circuit 506 (and injection circuit) may be provided, as long as the indirect load of the tank circuit is ensured. Furthermore, in the following some terminology may pertain to the complementary metal-oxide-semiconductor (CMOS) technology, e.g. the oscillator circuit 500 may be fabricated, for example, using CMOS fabrication processes. Illustratively, the oscillator circuit may be configured as a CMOS linearized transconductance. It is however understood that the aspects described in the following may also apply to different technology contexts.

Figure 5B:
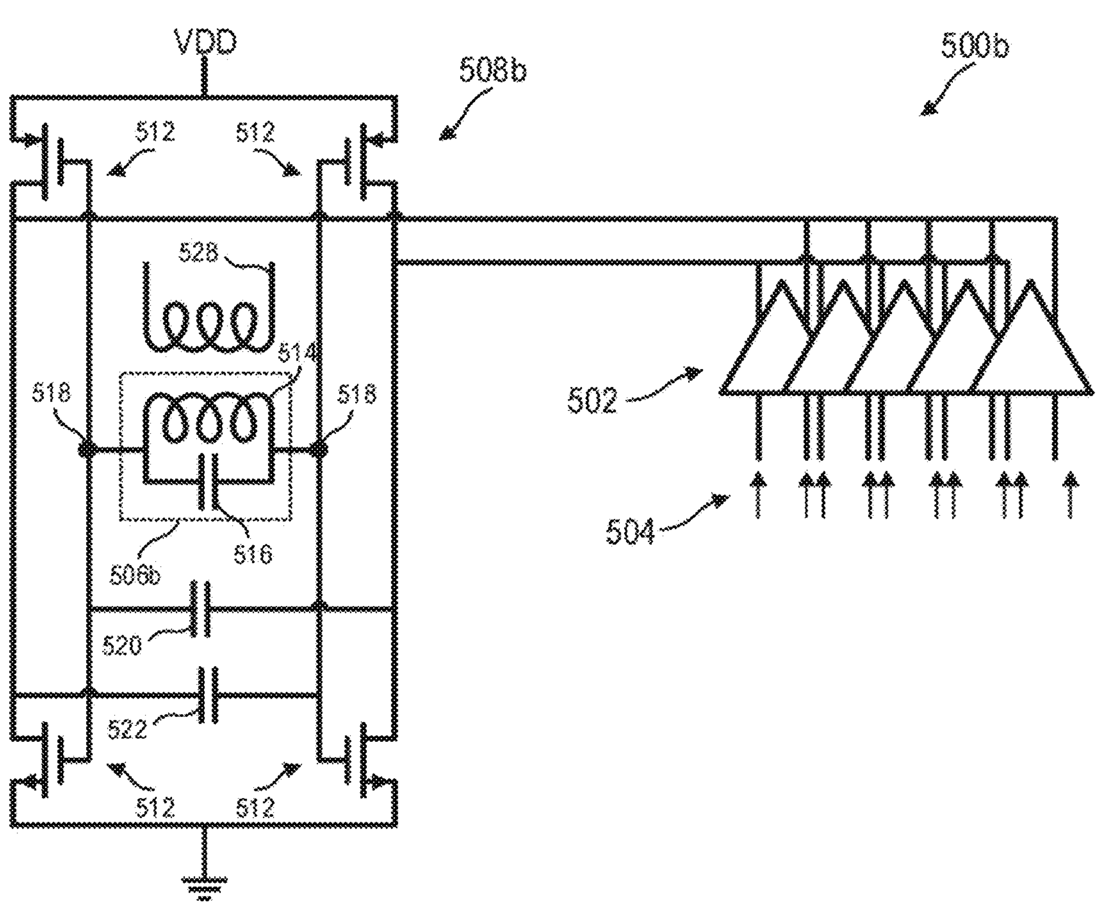
FIG. 5B shows an exemplary circuit diagram of an oscillator circuit in a schematic view, according to the present disclosure.

FIG. 5B shows an oscillator circuit **500*b* in a schematic representation, according to the present disclosure. The oscillator circuit 500*b* may be an exemplary implementation of the oscillator circuit 500, e.g. of the amplifier circuit 508 and tank circuit 506**.

The amplifier circuit **508*b* may include a plurality of transistors 512, e.g. four transistors 512, each including a respective gate node, drain node, and source node. As an example, the plurality of transistors 512 may be or include a plurality of CMOS transistors. The transistors 512 may be coupled pairwise at the respective gate nodes. Illustratively, the amplifier circuit 508*b* may include a first electrically conductive connection between a first gate node of a first transistor 512 and a second gate node of a second transistor 512, a second electrically conductive connection between a third gate node of a third transistor 512 and a fourth gate node of a fourth transistor 512**, etc.

The drain nodes and the gate nodes of the transistors 512 may not be shorted. Illustratively, the amplifier circuit **506*b* may have a configuration without a cross-coupling between the transistors 512. A direct connection (e.g., a direct electrically conductive connection) between the drain nodes and the gate nodes of the transistors 512 may thus be absent in the amplifier circuit 506*b***.

As shown in FIG. 5B, one or more of the transistors 512 may have one of the source node or drain node coupled to a voltage supply, VDD, and one or more other transistors 512 may have one of the source node or drain node coupled to a reference voltage (e.g., to ground, e.g. 0 V).

The tank circuit **506*b* may include any suitable component to generate an oscillator signal upon injection of a multi-phase signal. Illustratively, the oscillator circuit 500, 500*b* may be an injection-locked clock multiplier. As an example, the tank circuit 506*b* may include one or more tunable inductors 514 and one or more tunable capacitors 516 to tune the resonant frequency to provide a predefined oscillator frequency for the output signal. As an example, the one or more tunable inductors 514 and the one or more tunable capacitors 516 may be tuned to resonate at the fifth harmonic of the frequency of the driving signals 504 input to the injection amplifiers 502**.

The input of the tank circuit 506*b* (e.g., input nodes 518 of the tank circuit) may be coupled with the gate nodes of the transistors 512. Illustratively, the tank circuit 506*b* may be coupled with the electrically conductive connections that couple pairwise the gates of the transistors 512. The injection circuit (e.g., the outputs of the injection amplifiers 502) may instead be coupled to the drain nodes and/or source nodes of the transistors 512, as shown in FIG. 5B. Illustratively, the injection circuit may be coupled with the electrically conductive connections that couple pairwise the drain nodes and/or source nodes of the transistors 512.

The non-cross-coupled configuration of the transistors 512 may thus provide that the tank circuit 506*b* is not coupled to the drains/sources of the transistors 512, and so that the injection circuit and the tank circuit 506*b* are indirectly coupled through the transistors 512 of the amplifier circuit 508*b*.

Figure 5C:
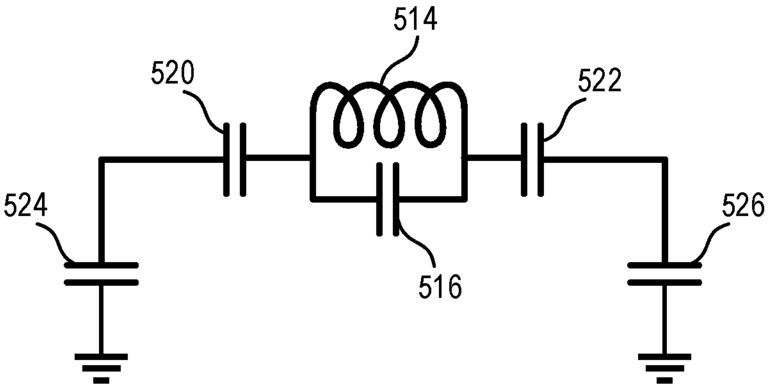
FIG. 5C shows an exemplary circuit diagram of a tank circuit and a capacitive voltage divider, according to the present disclosure.

FIG. 5C shows an exemplary circuit diagram of the tank circuit and a capacitive voltage divider, according to the present disclosure. In an exemplary configuration, the oscillator circuit 500, 500*b* may include a capacitive voltage divider to couple the injection circuit with the amplifier circuit. Illustratively, the output(s) of the injection amplifiers 502 may be coupled with the amplifier circuit 508 via one or more capacitive voltage dividers, e.g. via a first capacitor 520 and a second capacitor 522. The capacitive voltage divider may provide counteracting the effect of the parasitic capacitance of the injection amplifiers, thus further improving the operation of the oscillator circuit. Such configuration is further shown in FIG. 5C, in which the parasitic capacitance of the load of the injection amplifiers 502 is illustrated via corresponding capacitors 524, 526.

In an exemplary configuration, the oscillator circuit 500, 500*b* may include a coupling component 528, e.g. a transformer, configured to couple the tank circuit 506*b* with the outside of the oscillator circuit 500, 500*b*. The coupling component 528 may provide delivering the oscillator signal 510 generated in the tank circuit 506*b* towards the outside of the oscillator circuit 500, 500*b*. The coupling component 528 allows further reducing the impact of the parasitic load of the next stage (at the output). The coupling component 528 gives the possibility to trade off output amplitude and frequency coverage.

In the CMOS Linearized Transconductance shown in FIG. 5B, the injecting amplifiers 502 (drivers) are not loading the LC tank 506*b* directly, since the drains and gates of the transistors 512 are not shorted. The LC resonator 506*b* is located at the gate nodes and the positive feedback is connected to the drains via a capacitor divider, as shown in the simplified representation in FIG. 5C, which shows a simplified model of the LC tank 506*b* (neglecting the output node).

Deriving the resonance frequency of this structure gives, as result, $$f = \frac{f_0}{\sqrt{1 + \frac{1}{2C} \cdot \frac{C_{lit} n C_{par\_amp}}{C_{lit} + n C_{par\_amp}}}} = \frac{f_0}{\sqrt{1 + \frac{1}{2C} \cdot \frac{1}{K} n C_{par\_amp}}},$$

-continued $$\text{where } K = \frac{C_{lit} + n C_{par\_amp}}{C_{lit} n C_{par\_amp}}.$$

It can be shown, that for best phase noise performance K~2.2, the parasitic capacitance impact on the frequency is reduced significantly. This allows using a larger inductor 514 for the same multiplication factor (compared to a conventional configuration) thus reducing power consumption and increasing the possible tuning range.

Figure 6A:
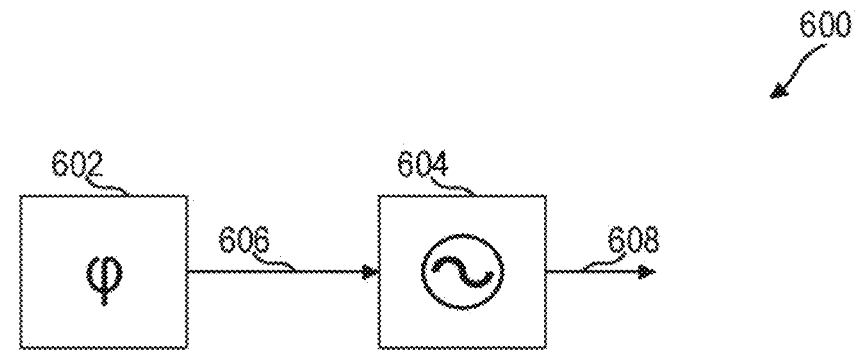
FIG. 6A and FIG. 6B each shows a system including a signal generator and an oscillator circuit in a schematic view, according to the present disclosure.

FIG. 6A shows a system 600 including an adapted signal generator and an adapted oscillator circuit in a schematic representation according to the present disclosure. The system 600 may thus be or include a multi-phase local oscillator according to the present disclosure.

The system 600 may include a signal generator 602 including one or more signal generators configured as the signal generator 350 described in relation to FIG. 3D and FIG. 3E, and may include an oscillator circuit 604 including one or more oscillator circuits configured as the oscillator circuit 500 described in relation to FIG. 5A to FIG. 5C.

The signal generator 602 may be configured to generate a multi-phase signal 606 including a plurality of phases (e.g., including a plurality of output signals each having a respective phase, as shown in FIG. 3D and FIG. 3E), and may be configured to provide (e.g., deliver) the multi-phase signal 606 to the oscillator circuit 604 to generate one or more oscillator signals 608. Illustratively, the signal generator 602 may be configured to provide the output signals of a last layer of interpolators as driving signals to the injection amplifiers of the one or more oscillator circuits.

The number of signal generators, oscillator circuits, and phases provided to an oscillator circuit, may be adapted according to a desired application. In an exemplary configuration, shown in FIG. 6B, a system 600*b* (e.g., the corresponding oscillator circuit 604*b*) may include four oscillator circuits 500 each configured to generate an oscillator signal 608*b* having an in-phase component and a quadrature component. The signal generator 602*b* may be configured to provide, to each oscillator circuit 500, a multi-phase signal including five phases, e.g., five output signals at a phase offset of 2π/5, to provide frequency multiplication at the 5-th harmonic and generate oscillator signals 608*b* at the desired frequency. The five phases may be different for each oscillator circuit 500, so that the respective output signals 608*b* have a respective phase, e.g. 0, π for a first oscillator circuit 500, 0.25π, 1.25π for a second oscillator circuit 500, 0.5π, 1.5π for a third oscillator circuit 500, and 0.75π, 1.75π for a fourth oscillator circuit 500. The system 600, 600*b* may thus provide generating a multi-phase oscillator signal 608*b* including a desired number of oscillator signals each at a respective phase and at a predefined frequency.

In this configuration, the signal generator 602*b* (illustratively, the multi-phase DTC) may receive reference signals at the sub-harmonic frequency $f_{LO}/5$ and control signals representing the desired phases for the output signals. Although not shown, the system 600, 600*b* may further include a reference signal generator configured to generate a reference signal and provide the reference signal to the signal generator 602. The signal generator may be configured to generate the reference signal(s) at a signal frequency that is a sub-harmonic of the oscillator frequency of the one or more oscillator signals 608, 608*b*.

Figure 6B:
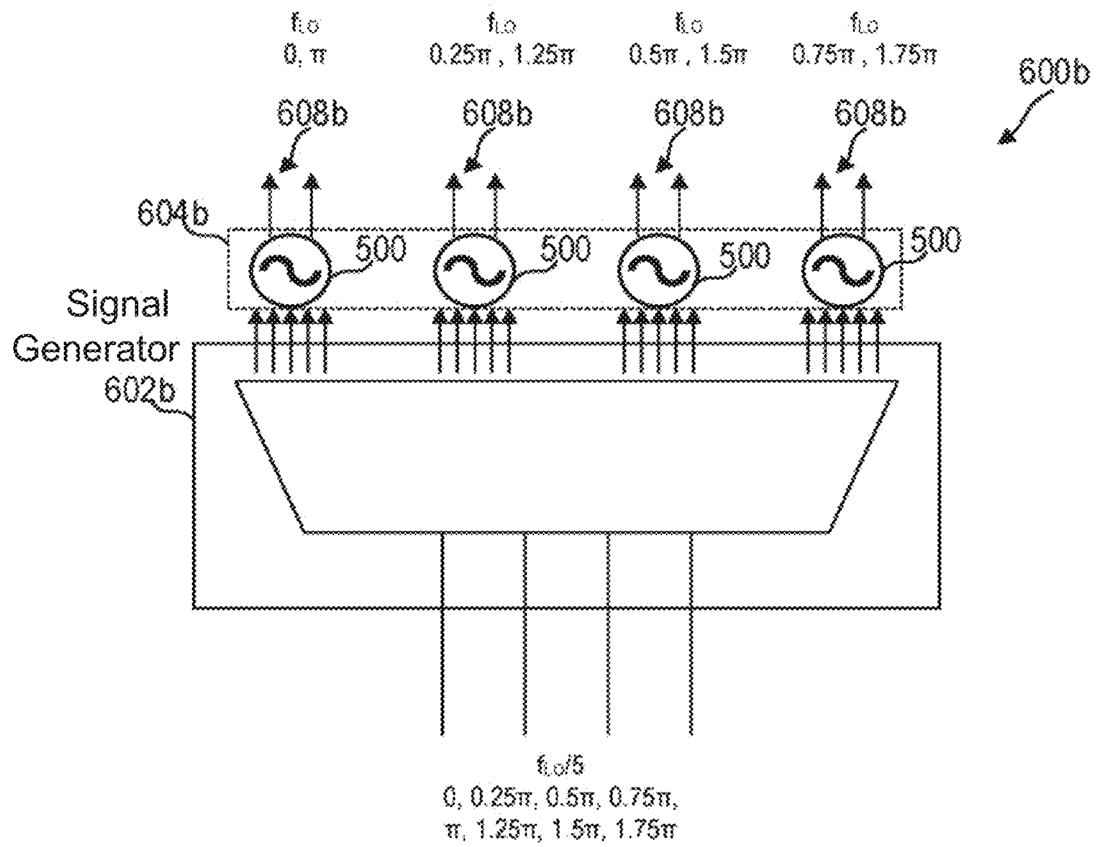

In the configuration in FIG. 6B, the multi-phase layered DTC 602*b* may thus generate twenty phases at the sub-harmonic frequency to allow for octa-phase generation while assuring sufficient resolution to allow error correction and keeping power consumption in check. The CMOS linearized transconductance oscillators 500 mitigate the additional capacitive load and Q degradation caused by the presence and operation of the injecting amplifiers while maintaining power consumption low and acceptable out of band phase noise.

According to an exemplary configuration, the system 600, 600*b* may be configured to provide (e.g., to deliver) the oscillator signal(s) 608, 608*b* to a digital multi-phase amplifier, e.g. a digital octa-phase amplifier. Illustratively, the system 600, 600*b* may include or may be coupled with a digital multi-phase amplifier. According to another exemplary configuration, the system 600, 600*b* may be configured to provide (e.g., to deliver) the oscillator signal(s) 608, 608*b* to a multi-phase filter, e.g. an octa-phase 8-path filter. Illustratively, the system 600, 600*b* may include or may be coupled with a multi-phase filter. These exemplary configuration may be related to relevant use cases for the adapted scheme described herein, but it is understood that the adapted signal generator, oscillator circuit, and system may found applications also in other contexts.

In the following, various examples are provided that refer to the signal generator 350, the oscillator circuit 500, the system 600, and the method 400. It is understood that the examples related to the devices may apply in a corresponding manner to the method, and vice versa.

Example 1 is a signal generator including: a plurality of interpolators; each interpolator of the plurality of interpolators being configured to: receive a first input signal having a first phase, and a second input signal having a second phase; generate a plurality of interpolated signals based on a plurality of interpolations of the first input signal with the second input signal, each interpolated signal has a respective phase based on the respective interpolation of the first phase with the second phase; and combine the interpolated signals with one another to provide an output signal. The plurality of interpolators include: a first plurality of interpolators, each interpolator of the first plurality of interpolators being configured to receive as first input signal a first reference signal and as second input signal a second reference signal; and a second plurality of interpolators, each interpolator of the second plurality of interpolators being configured to receive as first input signal an output signal from an interpolator of the first plurality of interpolators and as second input signal another output signal from another interpolator of the first plurality of interpolators.

In Example 2, the signal generator according to example 1 may optionally further include that the interpolators of the plurality of interpolators are configured such that the respective output signal has a phase that is a multiple of a predefined phase.

In Example 3, the signal generator according to example 2 may optionally further include that the interpolators of the first plurality of interpolators are configured such that the respective output signals of interpolators that are adjacent to one another have phases that are consecutive integer multiples of the predefined phase.

In Example 4, the signal generator according to example 2 or 3 may optionally further include that the first plurality of interpolators includes a number N of interpolators, and that the predefined phase is inversely proportional to the number N of interpolators.

In Example 5, the signal generator according to example 4 may optionally further include that the interpolators of the first plurality of interpolators are configured such that the respective output signals have a phase that is an integer multiple of 90°/(N+1).

In Example 6, the signal generator according to example 4 or 5 may optionally further include that the interpolators of the first plurality of interpolators are configured such that a phase difference between the phases of the output signals of adjacent interpolators of the first plurality of interpolators is inversely proportional to the number N of interpolators.

In Example 7, the signal generator according to example 6 may optionally further include that the interpolators of the first plurality of interpolators are configured such that a phase difference between the phases of the output signals of adjacent interpolators of the first plurality of interpolators is 90°/(N+1).

In Example 8, the signal generator according to any one of examples 1 to 7 may optionally further include that the interpolators of the plurality of interpolators are configured such that each output signal has a phase different from the phase of each other output signal of the interpolators of the plurality of interpolators.

In Example 9, the signal generator according to any one of examples 1 to 8 may optionally further include that, for at least one interpolator of the plurality of interpolators, the output signal has a phase in a range having as lower limit one of the first phase or the second phase, and as upper limit the other one of the first phase or the second phase.

In Example 10, the signal generator according to any one of examples 1 to 9 may optionally further include a controller configured to control interpolation coefficients of the plurality of interpolations of at least one interpolator of the plurality of interpolators.

In Example 11, the signal generator according to any one of examples 1 to 10 may optionally further include that at least one interpolator of the first plurality of interpolators is configured to provide the respective output signal as input signal to two interpolators of the second plurality of interpolators.

In Example 12, the signal generator according to any one of examples 1 to 11 may optionally further include that at least one interpolator of the second plurality of interpolators is configured to receive, as first input signal and second input signal the respective output signals of interpolators of the first plurality of interpolators that are adjacent to one another.

In Example 13, the signal generator according to example 2 may optionally further include that at least one interpolator of the second plurality of interpolators is configured to receive, as first input signal and second input signal output signals of interpolators of the first plurality of interpolators that are consecutive integer multiples of the predefined phase.

In Example 14, the signal generator according to any one of examples 1 to 13 may optionally further include that for each interpolator of the first plurality of interpolators, the first reference signal is an in-phase signal and the second reference signal is a quadrature signal.

In Example 15, the signal generator according to any one of examples 1 to 14 may optionally further include a signal distributor configured to receive a reference signal and distribute the reference signal to the interpolators of the first plurality of interpolators as respective first input signal and second input signal.

In Example 16, the signal generator according to example 15 may optionally further include that the reference signal includes an in-phase signal and a quadrature signal.

In Example 17, the signal generator according to any one of examples 1 to 16 may optionally further include that each interpolator of the plurality of interpolators includes a plurality of interpolator instances, that each interpolator instance has a plurality of possible phase states, and that each interpolator instance is configured to: receive the first input signal and the second input signal received at the respective interpolator; and generate an interpolated signal as an interpolation of the first input signal and the second input signal based on a selected phase state of the plurality of possible phase states.

In Example 18, the signal generator according to example 17 may optionally further include that each phase state is associated with respective interpolation coefficients for the first input signal and the second input signal.

In Example 19, the signal generator according to example 17 or 18 may optionally further include that the interpolator instances of the plurality of interpolators instances are coupled in parallel with one another.

In Example 20, the signal generator according to any one of examples 17 to 19 may optionally further include that the plurality of interpolator instances of at least one interpolator of the plurality of interpolators include a plurality of 1.5 bit interpolators.

In Example 21, the signal generator according to any one of examples 1 to 20 may optionally further include that the plurality of interpolators further include a third plurality of interpolators, and that each interpolator of the third plurality of interpolators is configured to receive as first input signal an output signal from an interpolator of the second plurality of interpolators and as second input signal another output signal from another interpolator of the second plurality of interpolators.

In Example 22, the signal generator according to any one of examples 1 to 21 may optionally further include that the signal generator is configured to be coupled with an oscillator circuit and to deliver a multi-phase signal to the oscillator circuit, the multi-phase signal including the output signals of the second plurality of interpolators, and that the first reference signal and the second reference signal have a frequency that is a sub-harmonic of an oscillator frequency of the oscillator circuit.

In general, the multi-phase signal delivered to the oscillator circuit may include the output signals of a final layer of interpolators of the signal generator. In an exemplary configuration, the second plurality of interpolators may be the final layer of interpolators. In other configurations, the signal generator may include further pluralities (e.g., third, fourth, etc.) of interpolators.

Example 23 is an oscillator circuit including: a plurality of injection amplifiers configured to receive a plurality of driving signals for inducing a generation of an oscillator signal; a tank circuit configured to generate the oscillator signal based on the plurality of driving signals; an amplifier circuit coupled with the tank circuit and configured to compensate for an energy loss of the tank circuit, the amplifier circuit being interposed between output nodes of the plurality of injection amplifiers and input nodes of the tank circuit such that the plurality of injection amplifiers are indirectly coupled with the tank circuit.

In Example 24, the oscillator circuit according to example 23 may optionally further include that the amplifier circuit includes a plurality of transistors each having a respective gate node, drain node, and source node; and that the transistors of the plurality of transistors are coupled pairwise at the respective gate nodes.

In Example 25, the oscillator circuit according to example 24 may optionally further include that the input nodes of the tank circuit are coupled with the gate nodes of the transistors of the plurality of transistors.

In Example 26, the oscillator circuit according to any one of examples 23 to 25 may optionally further include that the output nodes of the plurality of injection amplifiers are coupled with the amplifier circuit via respective capacitive voltage dividers.

In Example 27, the oscillator circuit according to any one of examples 23 to 26 may optionally further include a coupling component configured to couple the tank circuit with the outside of the oscillator circuit.

In Example 28, the oscillator circuit according to example 27 may optionally further include that the coupling component includes a transformer.

In Example 29, the oscillator circuit according to any one of examples 23 to 28 may optionally further include that the oscillator signal includes an in-phase oscillator signal and a quadrature oscillator signal.

In Example 30, the oscillator circuit according to any one of examples 23 to 29 may optionally further include that the tank circuit is configured to generate the oscillator signal having an oscillator frequency in the mmWave-frequency range.

Example 31 is a system including: one or more signal generators according to any one of examples 1 to 22, and one or more oscillator circuits according to any one of examples 23 to 30, each signal generator being configured to provide the output signals of a last layer of interpolators as driving signals to the injection amplifiers of the one or more oscillator circuits.

In Example 32, the system according to example 31 may optionally further include a reference signal generator configured to generate a reference signal and provide the reference signal to the one or more signal generators, the signal generator being configured to generate the reference signal at a signal frequency that is a sub-harmonic of the oscillator frequency of the one or more oscillator circuits.

In Example 33, the system according to example 31 or 32 may optionally further include that the oscillator circuit is an injection locked clock multiplier.

Example 34 is a signal generator including: a plurality of layers of interpolators, each layer of interpolators including a plurality of interpolators, each interpolator of the plurality of interpolators being configured to: receive a first input signal having a first phase, and a second input signal having a second phase; generate a plurality of interpolated signals based on a plurality of interpolations of the first input signal with the second input signal, each interpolated signal having a respective phase based on the respective interpolation of the first phase with the second phase, and combine the interpolated signals with one another to provide an output signal; the interpolators of a first layer of the plurality of layers being configured to receive as first input signal a first reference signal and as second input signal a second reference signal, the interpolators of the other layers of interpolators being configured to receive as first input signal an output signal from an interpolator of the preceding layer and as second input signal another output signal from another interpolator of the preceding layer, and the signal generator being configured to output a multi-phase signal including the output signals of the last layer of the plurality of layers.

In Example 35, the signal generator of example 34 may include one or more features of the signal generator according to any one of examples 1 to 22.

Example 36 is a method of generating a multi-phase signal, the method including: carrying out a first plurality of interpolations of a first reference signal having a first phase with a second reference signal having a second phase to provide a first plurality of interpolated signals, each interpolated signal having a respective phase based on the respective interpolation of the first phase with the second phase; and carrying out a second plurality of interpolations, each interpolation of the second plurality of interpolations including interpolating an interpolated signal of the first plurality of interpolated signals with another interpolated signal of the first plurality of interpolated signals to provide a second plurality of interpolated signals, each interpolated signal of the second plurality of interpolated signals having a respective phase based on the respective interpolation of the phases of the interpolated signals used for the interpolation.

In Example 37, the method of example 36 may include one or more features of the signal generator according to any one of examples 1 to 22.

Example 38 is a wireless communication device including: one or more signal generators according to any one of examples 1 to 22, and/or one or more oscillator circuits according to any one of examples 23 to 30.

Example 39 is a signal generator including: a plurality of interpolating means; each of the interpolating means being for: receiving a first input signal having a first phase, and a second input signal having a second phase; generating a plurality of interpolated signals based on a plurality of interpolations of the first input signal with the second input signal, each interpolated signal has a respective phase based on the respective interpolation of the first phase with the second phase; and combining the interpolated signals with one another to provide an output signal. The plurality of interpolating means include: a first plurality of interpolating means, each for receiving as first input signal a first reference signal and as second input signal a second reference signal; and a second plurality of interpolating means, each for receiving as first input signal an output signal from one of the first plurality of interpolating means and as second input signal another output signal from another one of the first plurality of interpolating means.

Example 40 is an oscillator circuit including: a plurality of injection amplifiers for receiving a plurality of driving signals for inducing a generation of an oscillator signal; a tank circuit for generating the oscillator signal based on the plurality of driving signals; an amplifier circuit coupled with the tank circuit for compensating for an energy loss of the tank circuit, the amplifier circuit being interposed between output nodes of the plurality of injection amplifiers and input nodes of the tank circuit such that the plurality of injection amplifiers are indirectly coupled with the tank circuit.

The term "processor" as used herein may be understood as any kind of technological entity that allows handling of data. The data may be handled according to one or more specific functions that the processor may execute. Further, a processor as used herein may be understood as any kind of circuit, e.g., any kind of analog or digital circuit. A processor may thus be or include an analog circuit, digital circuit, mixed-signal circuit, logic circuit (e.g., a hard-wired logic circuit or a programmable logic circuit), microprocessor (for example a Complex Instruction Set Computer (CISC) processor or a Reduced Instruction Set Computer (RISC) processor), Central Processing Unit (CPU), Graphics Processing Unit (GPU), Digital Signal Processor (DSP), Field Programmable Gate Array (FPGA), integrated circuit, Application Specific Integrated Circuit (ASIC), etc., or any combination thereof. A "processor" may also be a logic-implementing entity executing software, for example any kind of computer program, for example a computer program using a virtual machine code such as for example Java. A "processor" as used herein may also include any kind of cloud-based processing system that allows handling of data in a distributed manner, e.g. with a plurality of logic-implementing entities communicatively coupled with one another (e.g. over the internet) and each assigned to handling the data or part of the data. By way of illustration, an application running on a server and the server can also be a "processor". Any other kind of implementation of the respective functions, which will be described below in further detail, may also be understood as a processor. It is understood that any two (or more) of the processors detailed herein may be realized as a single entity with equivalent functionality or the like, and conversely that any single processor detailed herein may be realized as two (or more) separate entities with equivalent functionality or the like.

The term "system" detailed herein may be understood as a set of interacting elements, the elements may be, by way of example and not of limitation, one or more physical components (e.g., processors, transmitters and/or receivers) and/or one or more digital components (e.g., code segments, instructions, protocols). Generally, the system may include one or more functions to be operated (also referred to as "operating functions") of which each may be controlled for operating the whole system.

The term "memory" as used herein may be understood as a computer-readable medium (e.g., a non-transitory computer-readable medium), in which data or information can be stored for retrieval. References to "memory" included herein may thus be understood as referring to volatile or non-volatile memory, including random access memory (RAM), read-only memory (ROM), flash memory, solid-state storage, magnetic tape, hard disk drive, optical drive, 3D) XPoint™, among others, or any combination thereof. Furthermore, it is appreciated that registers, shift registers, processor registers, data buffers, among others, are also embraced herein by the term memory. It is also appreciated that a single component referred to as "memory" or "a memory" may be composed of more than one different type of memory, and thus may refer to a collective component including one or more types of memory. It is readily understood that any single memory component may be separated into multiple collectively equivalent memory components, and vice versa. Furthermore, while memory may be depicted as separate from one or more other components (such as in the drawings), it is understood that memory may be integrated within another component, such as on a common integrated chip.

The term "software" refers to any type of executable instruction, including firmware.

In the present disclosure, various aspects are described with terminology that may pertain to particular radio communication technologies, e.g. with terminology that may pertain to the mmWave context. It is however understood that the aspects described herein may correspondingly apply to other radio communication technologies, in which same (e.g., structurally same and/or functionally same) components, structures, operations, logic entities, etc. may be referred to with other terms pertaining to the other radio communication technologies.

The present disclosure may utilize or be related to radio communication technologies. While some examples may refer to specific radio communication technologies, the examples provided herein may be similarly applied to various other radio communication technologies, both existing and not yet formulated, particularly in cases where such radio communication technologies share similar features as disclosed regarding the examples described herein. For purposes of this disclosure, radio communication technologies may be classified as one of a Short Range radio communication technology or Cellular Wide Area radio communication technology. Short Range radio communication technologies may include Bluetooth®, WLAN (e.g., according to any IEEE 802.11 standard), and other similar radio communication technologies. Exemplary Cellular Wide Area radio communication technologies that the present disclosure may utilize include, but are not limited to: Long Term Evolution (LTE), Long Term Evolution-Advanced (LTE-A), 5th Generation (5G) communication systems, a Global System for Mobile Communications (GSM) radio communication technology, a General Packet Radio Service (GPRS) radio communication technology, an Enhanced Data Rates for GSM Evolution (EDGE) radio communication technology, and/or a Third Generation Partnership Project (3GPP) radio communication technology (e.g. UMTS (Universal Mobile Telecommunications System), FOMA (Freedom of Multimedia Access), 3GPP LTE (Long Term Evolution), 3GPP LTE Advanced (Long Term Evolution Advanced)), CDMA2000 (Code division multiple access 2000), CDPD (Cellular Digital Packet Data), Mobitex, 3G (Third Generation), CSD (Circuit Switched Data), HSCSD (High-Speed Circuit-Switched Data), UMTS (3G) (Universal Mobile Telecommunications System (Third Generation)), W-CDMA (UMTS) (Wideband Code Division Multiple Access (Universal Mobile Telecommunications System)), HSPA (High Speed Packet Access), HSDPA (High-Speed Downlink Packet Access), HSDPA Plus (HSDPA+), HSUPA (High-Speed Uplink Packet Access), HSUPA Plus (HSUPA+), HSPA+(High Speed Packet Access Plus), UMTS-TDD (Universal Mobile Telecommunications System-Time-Division Duplex), TD-CDMA (Time Division-Code Division Multiple Access), TD-CDMA (Time Division-Synchronous Code Division Multiple Access), 3GPP Rel. 8 (Pre-4G) (3rd Generation Partnership Project Release 8 (Pre-4th Generation)), 3GPP Rel. 9 (3rd Generation Partnership Project Release 9), 3GPP Rel. 10 (3rd Generation Partnership Project Release 10), 3GPP Rel. 11 (3rd Generation Partnership Project Release 11), 3GPP Rel. 12 (3rd Generation Partnership Project Release 12), 3GPP Rel. 13 (3rd Generation Partnership Project Release 12), 3GPP Rel. 14 (3rd Generation Partnership Project Release 14), 3GPP Rel. 15 (3rd Generation Partnership Project Release 15), 3GPP Rel. 16 (3rd Generation Partnership Project Release 16), 3GPP Rel. 17 (3rd Generation Partnership Project Release 17), 3GPP Rel. 18 (3rd Generation Partnership Project Release 18), 3GPP 5G, 3GPP LTE Extra, LTE-Advanced Pro, LTE Licensed-Assisted Access (LAA), MuLTEfire, UTRA (UMTS Terrestrial Radio Access), E-UTRA (Evolved UMTS Terrestrial Radio Access), LTE Advanced (4G) (Long Term Evolution Advanced (4th Generation)), cdmaOne (2G), CDMA2000 (3G) (Code division multiple access 2000 (Third generation)), EV-DO (Evolution-Data Optimized or Evolution-Data Only), AMPS (1G) (Advanced Mobile Phone System (1st Generation)), TACS/ETACS (Total Access Communication System/Extended Total Access Communication System), D-AMPS (2G) (Digital AMPS (2nd Generation)), PTT (Push-to-talk), MTS (Mobile Telephone System), WITS (Improved Mobile Telephone System), AMTS (Advanced Mobile Telephone System), OLT (Norwegian for Offentlig Landmobil Telefoni, Public Land Mobile Telephony), MTD (Swedish abbreviation for Mobiltelefonisystem D, or Mobile telephony system D), Autotel/PALM (Public Automated Land Mobile), ARP (Finnish for Autoradiopuhelin, car radio phone"), NMT (Nordic Mobile Telephony), Hicap (High capacity version of NTT (Nippon Telegraph and Telephone)), CDPD (Cellular Digital Packet Data), Mobitex, DataTAC, iDEN (Integrated Digital Enhanced Network), PDC (Personal Digital Cellular), CSD (Circuit Switched Data), PHS (Personal Handy-phone System), WiDEN (Wideband Integrated Digital Enhanced Network), iBurst, Unlicensed Mobile Access (UMA, also referred to as also referred to as 3GPP Generic Access Network, or GAN standard)), Zigbee, Bluetooth®, Wireless Gigabit Alliance (WiGig) standard, Worldwide Interoperability for Microwave Access (WiMax) (e.g., according to an IEEE 802.16 radio communication standard, e.g., WiMax fixed or WiMax mobile), mmWave standards in general (wireless systems operating at 10-90 GHz and above such as WiGig, IEEE 802.11ad, IEEE 802.11ay, etc.), technologies operating above 300 GHz and THz bands, (3GPP/LTE based or IEEE 802.11p and other) Vehicle-to-Vehicle (V2V) and Vehicle-to-X (V2X) and Vehicle-to-Infrastructure (V21) and Infrastructure-to-Vehicle (I2V) communication technologies, 3GPP cellular V2X, DSRC (Dedicated Short Range Communications) communication arrangements such as Intelligent-Transport-Systems, etc. Cellular Wide Area radio communication technologies also include "small cells" of such technologies, such as microcells, femtocells, and picocells. Cellular Wide Area radio communication technologies may be generally referred to herein as "cellular" communication technologies. As used herein, a first radio communication technology may be different from a second radio communication technology if the first and second radio communication technologies are based on different communication standards.

The present disclosure may use such radio communication technologies according to various spectrum management schemes, including, but not limited to, dedicated licensed spectrum, unlicensed spectrum, (licensed) shared spectrum (such as LSA, "Licensed Shared Access," in 2.3-2.4 GHz, 3.4-3.6 GHz, 3.6-3.8 GHz and further frequencies and SAS, "Spectrum Access System," in 3.55-3.7 GHz and further frequencies), and may use various spectrum bands including, but not limited to, IMT (International Mobile Telecommunications) spectrum (including 450-470 MHz, 790-960 MHz, 1710-2025 MHz, 2110-2200 MHz, 2300-2400 MHz, 2500-2690 MHz, 698-790 MHz, 610-790 MHz, 3400-3600 MHz, etc., where some bands may be limited to specific region(s) and/or countries), IMT-advanced spectrum, IMT-2020 spectrum (expected to include 3600-3800 MHz, 3.5 GHz bands, 700 MHz bands, bands within the 24.25-86 GHz range, etc.), spectrum made available under FCC's "Spectrum Frontier" 5G initiative (including 27.5-28.35 GHz, 29.1-29.25 GHz, 31-31.3 GHz, 37-38.6 GHz, 38.6-40 GHz, 42-42.5 GHz, 57-64 GHz, 64-71 GHz, 71-76 GHz, 81-86 GHz and 92-94 GHz, etc.), the ITS (Intelligent Transport Systems) band of 5.9 GHz (typically 5.85-5.925 GHz) and 63-64 GHz, bands currently allocated to WiGig such as WiGig Band 1 (57.24-59.40 GHz), WiGig Band 2 (59.40-61.56 GHz) and WiGig Band 3 (61.56-63.72 GHz) and WiGig Band 4 (63.72-65.88 GHz), the 70.2 GHz-71 GHz band, any band between 65.88 GHz and 71 GHz, bands currently allocated to automotive radar applications such as 76-81 GHz, and future bands including 94-300 GHz and above. Furthermore, aspects described herein can also employ radio communication technologies on a secondary basis on bands such as the TV White Space bands (typically below 790 MHz) where in particular the 400 MHz and 700 MHz bands are prospective candidates. Besides cellular applications, specific applications for vertical markets may be addressed such as PMSE (Program Making and Special Events), medical, health, surgery, automotive, low-latency, drones, etc. applications. Furthermore, aspects described herein may also use radio communication technologies with a hierarchical application, such as by introducing a hierarchical prioritization of usage for different types of users (e.g., low/medium/high priority, etc.), based on a prioritized access to the spectrum e.g., with highest priority to tier-1 users, followed by tier-2, then tier-3, etc. users, etc. Aspects described herein can also use radio communication technologies with different Single Carrier or OFDM flavors (CP-OFDM, SC-FDMA, SC-OFDM, filter bank-based multicarrier (FBMC), OFDMA, etc.) and in particular 3GPP NR (New Radio), which can include allocating the OFDM carrier data bit vectors to the corresponding symbol resources.

Unless explicitly specified, the term "transmit" encompasses both direct (point-to-point) and indirect transmission (via one or more intermediary points). Similarly, the term "receive" encompasses both direct and indirect reception. Furthermore, the terms "transmit", "receive", "communicate", and other similar terms encompass both physical transmission (e.g., the transmission of radio signals) and logical transmission (e.g., the transmission of digital data over a logical software-level connection). For example, a processor may transmit or receive data over a software-level connection with another processor in the form of radio signals, where radio-layer components carry out the physical transmission and reception, such as radio frequency (RF) transceivers and antennas, and the processors perform the logical transmission and reception over the software-level connection.

The term "communicate" encompasses one or both of transmitting and receiving, i.e., unidirectional or bidirectional communication in one or both of the incoming and outgoing directions. In general, the term "communicate" may include the exchange of data, e.g., unidirectional or bidirectional exchange in one or both of the incoming and outgoing directions.

The term "calculate" encompasses both 'direct' calculations via a mathematical expression/formula/relationship and 'indirect' calculations via lookup or hash tables and other array indexing or searching operations.

As utilized herein, the term "derived from" designates being obtained directly or indirectly from a specific source. Accordingly, data derived from a source includes data obtained directly from the source or indirectly from the source, i.e. through one or more secondary agents.

The word "exemplary" is used herein to mean "serving as an example, instance, or illustration". Any embodiment or design described herein as "exemplary" is not necessarily to be construed as preferred or advantageous over other embodiments or designs.

The words "plural" and "multiple" in the description and the claims, if any, are used to expressly refer to a quantity greater than one. Accordingly, any phrases explicitly invoking the aforementioned words (e.g. "a plurality of [objects]", "multiple [objects]") referring to a quantity of objects is intended to expressly refer more than one of the said objects. For instance, the phrase "a plurality" may be understood to include a numerical quantity greater than or equal to two (e.g., two, three, four, five, [ . . . ], etc.). The terms "group", "set", "collection", "series", "sequence", "grouping", "selection", etc., and the like in the description and in the claims, if any, are used to refer to a quantity equal to or greater than one, i.e. one or more. Accordingly, the phrases "a group of [objects]", "a set of [objects]", "a collection of [objects]", "a series of [objects]", "a sequence of [objects]", "a grouping of [objects]", "a selection of [objects]", "[object] group", "[object] set", "[object] collection", "[object] series", "[object] sequence", "[object] grouping", "[object] selection", etc., used herein in relation to a quantity of objects is intended to refer to a quantity of one or more of said objects. It is appreciated that unless directly referred to with an explicitly stated plural quantity (e.g. "two [objects]", "three of the [objects]", "ten or more [objects]", "at least four [objects]", etc.) or express use of the words "plural", "multiple", or similar phrases, references to quantities of objects are intended to refer to one or more of said objects.

Throughout the drawings, it should be noted that like reference numbers are used to depict the same or similar elements, features, and structures, unless otherwise noted.

The phrase "at least one" and "one or more" may be understood to include a numerical quantity greater than or equal to one (e.g., one, two, three, four, [ . . . ], etc.). The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of individual listed elements.

As used herein, a signal (e.g., data) that is "indicative of" or "representative of" a value or other information may be a digital or analog signal that encodes or otherwise communicates the value or other information in a manner that can be decoded by and/or cause a responsive action in a component receiving the signal. The signal may be stored or buffered in computer readable storage medium prior to its receipt by the receiving component and the receiving component may retrieve the signal from the storage medium. Further, a "value" that is "indicative of" or "representative of" some quantity, state, or parameter may be physically embodied as a digital signal, an analog signal, or stored bits that encode or otherwise communicate the value.

While the above descriptions and connected figures may depict electronic device components as separate elements, skilled persons will appreciate the various possibilities to combine or integrate discrete elements into a single element. Such may include combining two or more circuits for form a single circuit, mounting two or more circuits onto a common chip or chassis to form an integrated element, executing discrete software components on a common processor core, etc. Conversely, skilled persons will recognize the possibility to separate a single element into two or more discrete elements, such as splitting a single circuit into two or more separate circuits, separating a chip or chassis into discrete elements originally provided thereon, separating a software component into two or more sections and executing each on a separate processor core, etc.

It is appreciated that implementations of methods detailed herein are demonstrative in nature, and are thus understood as capable of being implemented in a corresponding device. Likewise, it is appreciated that implementations of devices detailed herein are understood as capable of being implemented as a corresponding method. It is thus understood that a device corresponding to a method detailed herein may include one or more components configured to perform each aspect of the related method.

All acronyms defined in the above description additionally hold in all claims included herein.

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

What is claimed is:

1. A signal generator comprising:

a plurality of layers, each layer of the plurality of layers comprising a plurality of interpolators, wherein each interpolator of a first layer of the plurality of layers is adaptable to:

receive a first reference signal having a first phase, and a second reference signal having a second phase;

generate a plurality of interpolated signals based on a plurality of interpolations of the first reference signal with the second reference signal, wherein each interpolated signal has a respective phase based on the respective interpolation of the first phase with the second phase; and combine the plurality of interpolated signals with one another to provide an output signal, and wherein each interpolator of other layers of the plurality of layers is adaptable to receive respective output signals from two different interpolators of the preceding layer of the plurality of layers.

2. The signal generator according to claim 1, wherein the plurality of interpolators of each layer of the plurality of layers is adaptable such that respective output signals have a phase that is a multiple of a predefined phase.

3. The signal generator according to claim 2, wherein adjacent interpolators of a plurality of interpolators of the first layer are adaptable such that their respective output signals have phases that are consecutive integer multiples of the predefined phase.

4. The signal generator according to claim 2, wherein the first layer comprises a number of interpolators, and wherein the predefined phase is inversely proportional to the number of interpolators.

5. The signal generator according to claim 4, wherein the plurality of interpolators of the first layer is adaptable such that the respective output signals have a phase that is an integer multiple of 90°/the number of interpolators +1.

6. The signal generator according to claim 4, wherein the plurality of interpolators of the first layer is adaptable such that a phase difference between the phases of the output signals of adjacent interpolators of the first layer is inversely proportional to the number of interpolators.

7. The signal generator according to claim 6, wherein the plurality of interpolators of the first layer is adaptable such that a phase difference between the phases of the output signals of adjacent interpolators of the first layer is 90°/the number of interpolators +1.

8. The signal generator according to claim 2, wherein at least one interpolator of the other layers is adaptable to receive output signals of interpolators of the first layer that are consecutive integer multiples of the predefined phase.

9. The signal generator according to claim 1, wherein the interpolators of each layer of the plurality of layers are adaptable such that each output signal has a phase different from the phase of each other output signal of the interpolators of each layer of the plurality of layers.

10. The signal generator according to claim 1, wherein, for at least one of the plurality of interpolators of each layer of the plurality of layers, the output signal has a phase in a range having as lower limit one of the first phase or the second phase, and as upper limit the other one of the first phase or the second phase.

11. The signal generator according to claim 1, wherein for each interpolator of the first layer, the first reference signal is an in-phase signal and the second reference signal is a quadrature signal.

12. The signal generator according to claim 1, wherein each interpolator of the plurality of interpolators comprises a plurality of interpolator instances, wherein each interpolator instance of the plurality of interpolator instances has a plurality of possible phase states, and wherein each interpolator instance of the plurality of interpolator instances is adaptable to:

receive the first reference signal and the second reference signal; and generate an interpolated signal as an interpolation of the first reference signal and the second reference signal based on a selected phase state of the plurality of possible phase states.

13. The signal generator according to claim 12, wherein each phase state is associated with respective interpolation coefficients for the first reference signal and the second reference signal.

14. The signal generator according to claim 12, wherein the interpolator instances of the plurality of interpolators instances are coupled in parallel with one another.

15. A system comprising:

a signal generator and an oscillator circuit coupled with the signal generator, wherein the signal generator comprises:

a plurality of layers wherein each layer of the plurality of layers comprises a plurality of interpolators, wherein each interpolator of a first layer of the plurality of layers is adaptable to:

receive a first reference signal having a first phase, and a second reference signal having a second phase;

generate a plurality of interpolated signals based on a plurality of interpolations of the first reference signal with the second reference signal, each interpolated signal having a respective phase based on the respective interpolation of the first phase with the second phase; and combine the plurality of interpolated signals with one another to provide an output signal, wherein interpolators of other layers of the plurality of layers are adaptable to receive respective output signals, wherein the signal generator is adaptable to deliver output signals of the last layer of the plurality of layers as a plurality of driving signals to the oscillator circuit, and wherein the first reference signal and the second reference signal have a frequency that is a sub-harmonic of an oscillator frequency of the oscillator circuit.

16. The system according to claim 15, wherein the oscillator circuit comprises:

a plurality of injection amplifiers adaptable to receive the plurality of driving signals for inducing a generation of an oscillator signal of the oscillator circuit;

a tank circuit adaptable to generate the oscillator signal based on the plurality of driving signals; and an amplifier circuit coupled with the tank circuit and adaptable to compensate for an energy loss of the tank circuit, wherein the amplifier circuit is interposed between output nodes of the plurality of injection amplifiers and input nodes of the tank circuit such that the plurality of injection amplifiers is indirectly coupled with the tank circuit.

17. The system according to claim 16, wherein the amplifier circuit comprises a plurality of transistors each having a respective gate node, drain node, and source node; and wherein transistors of the plurality of transistors are coupled pairwise at the respective gate nodes.

18. The system according to claim 17, wherein the input nodes of the tank circuit are coupled with the gate nodes of the transistors of the plurality of transistors.

19. The system according to claim 16, wherein the output nodes of the plurality of injection amplifiers are coupled with the amplifier circuit via respective capacitive voltage dividers.

* * * * *